US012787564B2

(12) United States Patent
Kim et al.

(10) Patent No.: US 12,787,564 B2

(45) Date of Patent: Nov. 3, 2026

(54) DISPLAY DEVICE

(71) Applicant: LG Display Co., Ltd., Seoul (KR)

(72) Inventors: Yong Cheol Kim, Paju-si (KR); Eun Hyung Lee, Paju-si (KR); Eun Young Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 465 days.

(21) Appl. No.: 18/211,063

(22) Filed: Jun. 16, 2023

(65) Prior Publication Data

US 2024/0188345 A1 Jun. 6, 2024

(30) Foreign Application Priority Data

Dec. 5, 2022 (KR) ........................ 10-2022-0167293

(51) Int. Cl.

*H10K 59/124* (2023.01)
*H10K 59/122* (2023.01)
*H10K 59/35* (2023.01)

(52) U.S. Cl.

CPC ......... *H10K 59/124* (2023.02); *H10K 59/122* (2023.02); *H10K 59/352* (2023.02)

(58) Field of Classification Search

CPC .... H10K 50/858; H10K 59/122; H10K 59/65; H10K 59/121; H10K 59/124; H10K 59/352

See application file for complete search history.

(56) References Cited

U.S. PATENT DOCUMENTS

| | | | | |
|---|---|---|---|---|
| 2015/0001486 A1* | 1/2015 | Kim | H10K 59/122 | |
| | | | 438/23 | |
| 2017/0025489 A1* | 1/2017 | Choi | H10K 59/122 | |
| 2018/0033642 A1* | 2/2018 | Lu | C23C 14/0073 | |
| 2020/0212331 A1* | 7/2020 | Lee | H10K 59/122 | |
| 2021/0183296 A1* | 6/2021 | Lee | G09G 3/2003 | |
| 2021/0193749 A1* | 6/2021 | Kim | H10K 59/121 | |
| 2022/0130935 A1* | 4/2022 | Kim | H04N 23/51 | |

FOREIGN PATENT DOCUMENTS

| | | |
|---|---|---|
| KR | 10-2016-0067314 A | 6/2016 |
| KR | 10-2138100 B1 | 7/2020 |
| KR | 10-2021-0080710 A | 7/2021 |
| KR | 10-2021-0082316 A | 7/2021 |
| KR | 10-2022-0029429 A | 3/2022 |

* cited by examiner

*Primary Examiner* — Vongsavanh Sengdara

(74) *Attorney, Agent, or Firm* — Birch, Stewart, Kolasch & Birch, LLP

(57) ABSTRACT

A display device can include a display panel having a first display area in which first pixels are disposed, and a second display area in which second pixels and a light-transmission area disposed between the second pixels are disposed, and a sensor disposed to correspond to the second display area. One of the second pixels includes sub-pixels. The display panel can include a circuit layer, a light emitting element layer disposed on the circuit layer, and an anti-reflection layer disposed between a planarization layer of the circuit layer and an anode electrode of the light emitting element layer. Further, a space is formed between an anode electrode of one sub-pixel and an anode electrode of another adjacent sub-pixel, and a path of light directed to the sensor through the space is changed by the anti-reflection layer. Accordingly, the display device can minimize the amount of light reaching the sensor.

20 Claims, 19 Drawing Sheets

FIG. 13

| Design value | | Blocking rate for each wavelength (%) | | |
|---|---|---|---|---|
| Refractive index (n) | Thick (T1) | 450nm | 550nm | 650nm |
| 2.0 | 70nm | 14.4 | 16.6 | 12.8 |
| | 210nm | 7.3 | 16.5 | 10.2 |
| | 340nm | 5.5 | 16.5 | 5.4 |
| | 480nm | 11.4 | 16.6 | 4.8 |
| 1.8 | 70nm | 9.6 | 10.2 | 7.7 |
| | 210nm | 6.5 | 10.3 | 6.7 |
| | 340nm | 5.6 | 10.3 | 5.0 |
| | 480nm | 5.8 | 7.5 | 6.8 |

| Design value | | IR Blocking rate (%) |
|---|---|---|
| Refractive index (n) | Thick (T1+T2) | |
| 2.0 | 80nm | 13.2 |
| | 240nm | 13.2 |
| | 410nm | 13.2 |
| 1.8 | 90nm | 8.2 |
| | 270nm | 8.2 |
| | 450nm | 8.2 |

FIG. 19

| Design value | | Blocking rate for each wavelength (%) | | |
|---|---|---|---|---|
| Refractive index (n) | Thick (T1) | 450nm | 550nm | 650nm |
| 2.0 | 70nm | 17.6 | 20.3 | 15.6 |
| | 210nm | 8.9 | 20.1 | 12.4 |
| | 340nm | 6.7 | 20.1 | 6.6 |
| | 480nm | 13.9 | 20.3 | 5.9 |
| 1.8 | 70nm | 11.5 | 12.2 | 9.2 |
| | 210nm | 7.8 | 12.4 | 8.0 |
| | 340nm | 6.7 | 12.4 | 6.0 |
| | 480nm | 7.0 | 9.0 | 8.2 |

FIG. 20

| Design value | | IR Blocking rate (%) |
|---|---|---|
| Refractive index (n) | Thick (T1+T2) | |
| 2.0 | 80nm | 16.1 |
| | 240nm | 16.1 |
| | 410nm | 16.1 |
| 1.8 | 90nm | 9.8 |
| | 270nm | 9.8 |
| | 450nm | 9.8 |

FIG. 21

| Refractive Index / T3/W | Amount of light reaching lower portion of lens layer for each refractive index: n=2.0 | n=1.8 |
|---|---|---|
| 0.065 | 78% | 80% |
| 0.1 | 81% | 82% |
| 0.13 | 84% | 86% |

DISPLAY DEVICE

CROSS-REFERENCE TO RELATED APPLICATION

This application claims priority to Korean Patent Application No. 10-2022-0167293, filed in the Republic of Korea on Dec. 5, 2022, the entire contents of which are hereby expressly incorporated by reference into the present application.

BACKGROUND

1. Field

Embodiments of the present disclosure relate to a display device. In detail, the embodiments relate to a display device that minimizes the influence of light directed to a sensor by means of a light-path changing structure disposed in a display panel.

2. Discussion of the Related Art

Electroluminescence display devices can be classified into inorganic light-emitting display devices and organic light-emitting display devices according to a material of an emission layer. An active matrix organic light-emitting display device includes an organic light-emitting diode (OLED) that generates light by itself and has advantages in terms of a high response rate, high luminous efficiency, high luminance, and a large viewing angle. In an organic light-emitting display device, an OLED is formed at each pixel. The organic light-emitting display device has a high response rate, high luminous efficiency, high luminance, and a large viewing angle and is capable of expressing black gradation in perfect or near perfect black, thereby achieving a high contrast ratio and a high color reproduction rate.

Multi-media functions of mobile terminals are being improved. For example, a camera is built into a smart phone, and the resolution of the camera is increasing to the level of a conventional digital camera. However, the front camera of the smart phone can limit the screen design, thereby making it difficult to design the screen. In order to reduce the space occupied by the camera, a screen design including a notch or punch hole has been adopted for smart phones, but the screen size can still be limited due to the notch or punch hole, which can provide some issues in implementing a full-screen display effectively.

In order to implement a full-screen display, it is proposed to provide an imaging area with low-resolution pixels within a screen of a display panel, and to dispose electronic components such as a camera and various sensors in a position opposite to the imaging area below the display panel. Here, each of the pixels can include a plurality of sub-pixels.

However, there can be a limitation in that light passing through spaces between sub-pixels affects cameras and various sensors. For example, in the case of cameras, there can be an issue in that image crosstalk distortion can occur due to the light. In addition, in the case of infrared sensors, there is an issue in that an error can occur in recognizing objects (such as faces) due to the light.

Accordingly, there is a demand for a structurally improved display device to minimize the influence of various sensors by light passing through spaces between pixels.

SUMMARY OF THE DISCLOSURE

The embodiments according to the present invention provide a display device that minimizes the inflow of light that adversely affects a sensor by means of various light-path changing structures disposed in a display panel.

The embodiments according to the present invention provide a display device that adjusts the influence of light on a sensor by presenting various design criteria for the light-path changing structure.

Objectives to be solved by embodiments are not limited to the objectives described above, and objectives which are not described above will be clearly understood by those skilled in the art from the following descriptions.

The above and other objects are achieved by the various embodiments of the present invention that provide a display device including a display panel having a first display area in which a plurality of first pixels are disposed, and a second display area in which a plurality of second pixels and a light-transmission area disposed between the second pixels are disposed, and a sensor disposed to correspond to the second display area, wherein the display panel can include a substrate, a circuit layer disposed on the substrate, a light emitting element layer disposed on the circuit layer, and an anti-reflection layer disposed between a planarization layer of the circuit layer and an anode electrode of the light emitting element layer, the second pixel can include a plurality of sub-pixels, a space is formed between an anode electrode of one of the plurality of sub-pixels and an anode electrode of another sub-pixel disposed adjacent to each other with the one sub-pixel, and a path of light directed to the sensor through the space can be changed by means of the anti-reflection layer.

The above and other objects are achieved by the various embodiments of the present invention that provide a display device including a display panel having a first display area in which a plurality of first pixels are disposed, and a second display area in which a plurality of second pixels and a light-transmission area disposed between the second pixels are disposed, and a sensor disposed to correspond to the second display area, wherein the display panel can include a substrate, a circuit layer disposed on the substrate, a light emitting element layer disposed on the circuit layer, and an anti-reflection layer disposed between a planarization layer of the circuit layer and an anode electrode of the light emitting element layer, the second pixel can include a plurality of sub-pixels and a pixel-defining film disposed between the sub-pixels, and the pixel-defining film can be disposed to be overlapped with the anti-reflection layer.

According to an embodiment of the present invention, light introduced into a sensor can be minimized by means of various light-path changing structures disposed in a display panel.

The embodiments according to the present invention can present design criteria for various light-path changing structures. For example, the embodiments can present various design criteria for the thickness, shape and the like of the light-path changing structure in consideration of light formed in sub-pixels and an influence between the light and a sensor. Accordingly, the embodiments can adjust the influence of light on the sensor.

The embodiments according to the present invention can increase the performance of the sensor by minimizing the influence of light on the sensor, and enables low-power driving of the sensor.

Various useful advantages and effects of the embodiments according to the present invention are not limited to the above-described contents and will be more easily understood from descriptions of the specific embodiments.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

FIG. 13 is a table showing a blocking rate for each wavelength that is changed by a refractive index and thickness of an anti-reflection layer provided in the light-path changing structure according to the first embodiment;

FIG. 19 is a table showing blocking rates for each wavelength changed by a lens layer provided in the light-path changing structure according to the third embodiment;

FIG. 20 is a table showing infrared-ray blocking rates by a lens layer provided as the light-path changing structure according to the third embodiment; and FIG. 21 is a diagram showing the amount of light reaching an optical device according to the thickness relative to the width of the lens layer provided in the light-path changing structure according to the third embodiment.

DETAILED DESCRIPTION OF THE EMBODIMENTS

Figure 1:
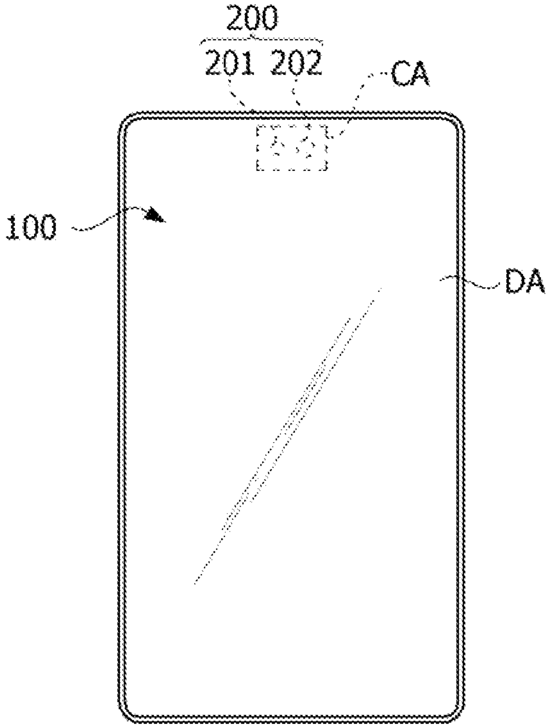
FIG. 1 is a conceptual diagram of a display device according to one embodiment of the present disclosure.

Advantages and features of the present disclosure and methods to achieve them will become apparent from the descriptions of embodiments herein below with reference to the accompanying drawings. However, the present disclosure is not limited to the embodiments disclosed herein but can be implemented in various different forms. The embodiments are provided for making the disclosure of the present disclosure thorough and for fully conveying the scope of the present disclosure to those skilled in the art. Further, the terms like 'present invention' and 'present disclosure' can be interchangeably used herein.

Shapes, sizes, ratios, angles, numbers, and the like disclosed in the drawings for describing the embodiments of the present disclosure are exemplary, and the present disclosure is not limited to the illustrated items. Like reference numerals refer to like elements throughout. In addition, in describing the present disclosure, if it is determined that the detailed description of the related known technology can unnecessarily obscure the subject matter of the present disclosure, the detailed description thereof will be omitted.

When "include", "have", "comprise", or the like mentioned is in the present specification, other parts can be added unless "only" is used. In the case where the component is expressed in the singular, it includes the plural unless specifically stated otherwise.

In interpreting a component, it is interpreted to include an error range even if there is no separate description.

In the case of the description of the positional relationship, for example, if the positional relationship of the two parts is described as "on", "above", "bottom", "next to", etc., one or more other parts can be located between the two parts unless the term "directly" or "immediately" is explicitly used.

In the description for the embodiments, the first, second, etc. are used to describe various components, but these components are not limited by these terms. These terms are only used to distinguish one component from another. Therefore, the first component mentioned below can be a second component within the technical spirit of the present disclosure.

Throughout the specification, the same reference numerals refer to the same component.

The features of each of the various embodiments can be coupled or combined with each another, in whole or in part, and various technical interlocking and driving can be possible, and each of the embodiments can be implemented independently of each other or in conjunction with each other.

Recently, the importance of a display device as a visual information transmission medium has been further emphasized in information-oriented society, and display devices are being improved to meet requirements, such as low power consumption, reduction of thickness, weight reduction, high definition, high efficiency, and the like.

The display device according to one embodiment of the present invention can improve the performance of a sensor by minimizing the amount of light entering the sensor that adversely affects the sensor based on a light-path changing structure disposed on the inside of a display panel. Accordingly, said display device enables low-power operation as a result of improving the performance of said sensor.

In this case, the display device can offer design criteria for various light-path changing structures with respect to controlling the effect of light on the sensor. For example, the display device can present various factors (thickness, geometry, refractive index, etc.) that affect the light-path changing structure and embodiments of these factors that can minimize the amount of light adversely affecting the sensor. Further, all the components of each display device according to all embodiments of the present disclosure are operatively coupled and configured.

Figure 2A:
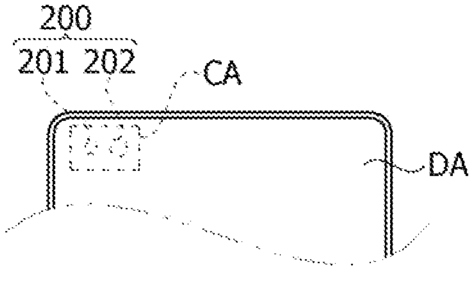
FIGS. 2A to 2D are diagrams illustrating various arrangement positions and shapes of a second display area of a display panel according to one embodiment of the present disclosure.
Figure 2B:
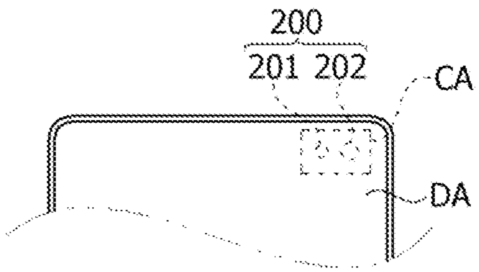
Figure 2C:
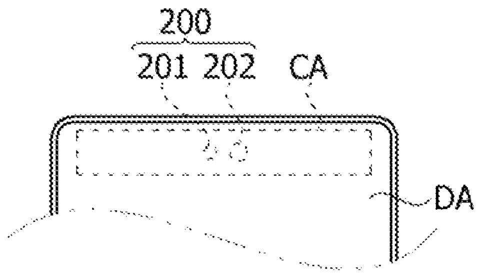
Figure 2D:
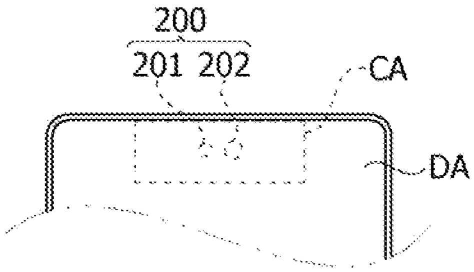
Figure 3:
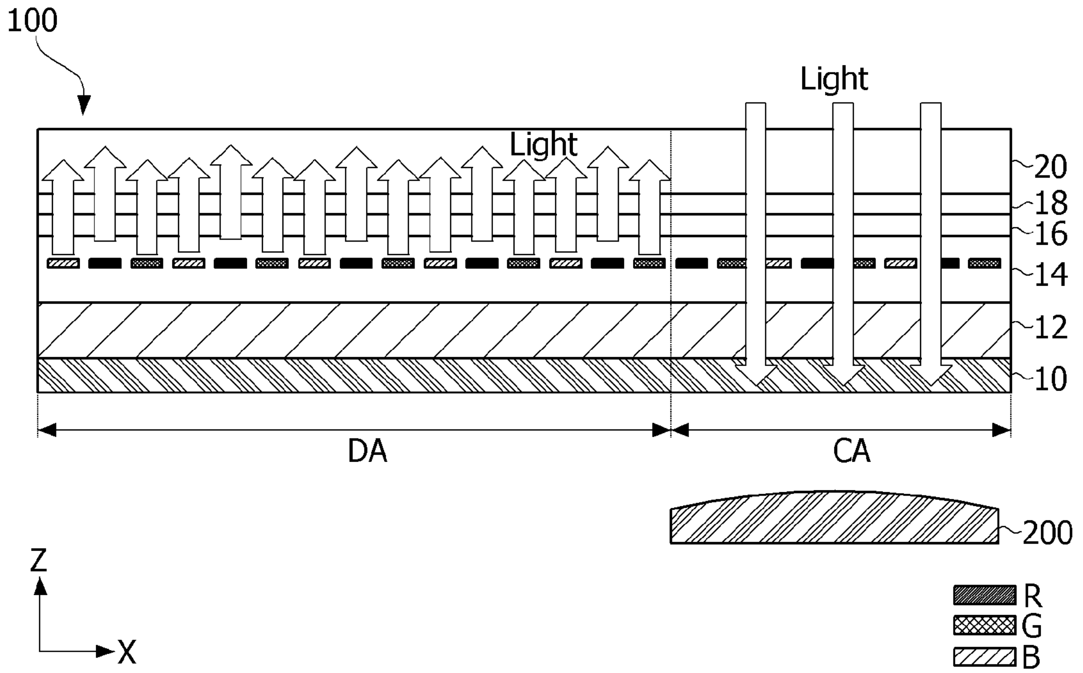
FIG. 3 is a schematic cross-sectional view of a display panel according to an embodiment of the present disclosure.
Figure 4:
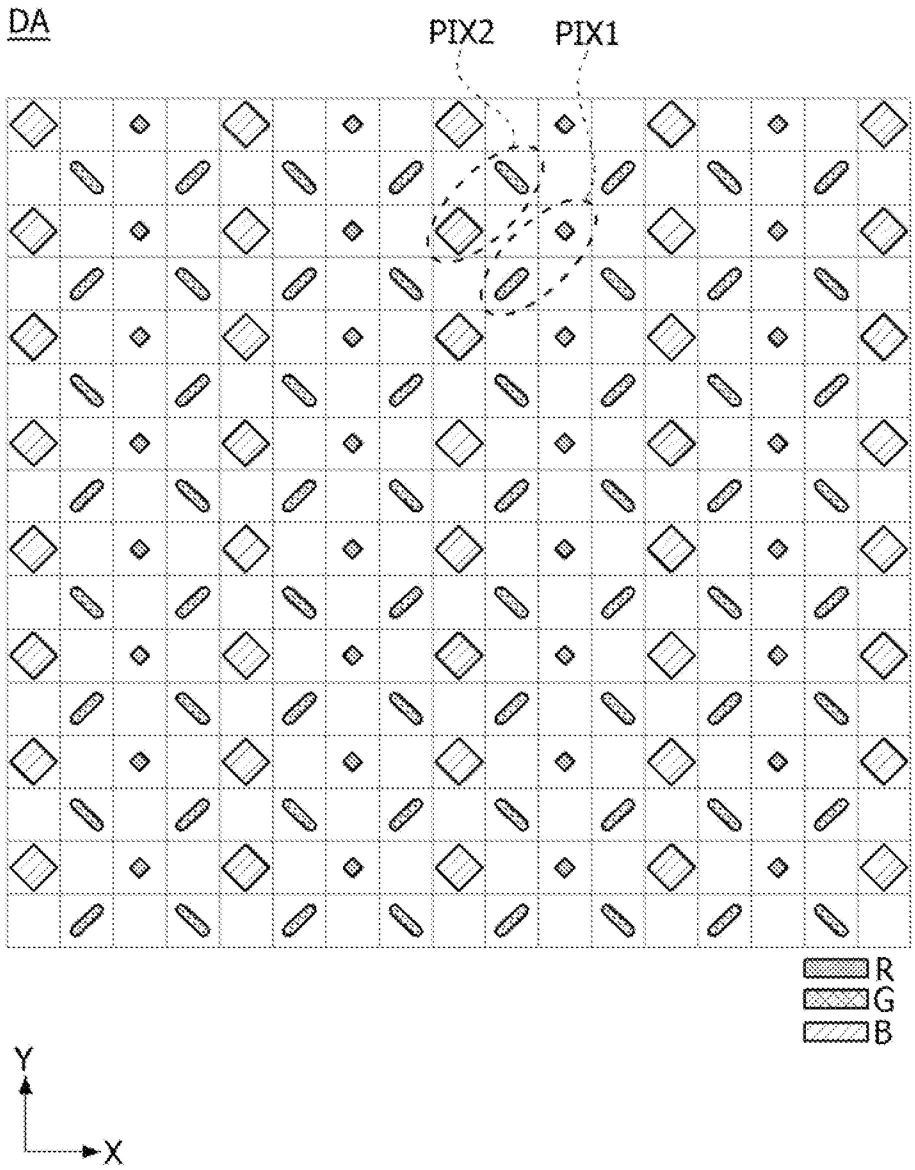
FIG. 4 is a diagram illustrating pixels arranged in a first display area of a display panel according to one embodiment of the present disclosure.

FIG. 1 is a conceptual diagram of a display device according to one embodiment of the present disclosure, FIGS. 2A to 2D are diagrams illustrating various arrangement positions and shapes of a second display area of a display panel according to one embodiment of the present disclosure, FIG. 3 is a schematic cross-sectional view of a display panel according to an embodiment of the present disclosure, and FIG. 4 is a diagram illustrating pixels arranged in a first display area of a display panel according to one embodiment of the present disclosure.

Referring to FIG. 1, a display device according to one embodiment of the present invention includes a display panel 100, an optical device 200, and a case, and the entire front surface of the display panel 100 can be implemented as a display area. Accordingly, the display device can implement a full-screen display. Further, the optical device 200 can include an image sensor (or camera), a proximity sensor, a white light illumination device, an optical device for face recognition, and the like.

The display area can include a first display area DA and a second display area CA. Here, both the first display area DA and the second display area CA output images, but can have different resolutions.

For example, the resolution of the plurality of second pixels disposed in the second display area CA can be lower than the resolution of the plurality of first pixels disposed in the first display area DA. A sufficient amount of light can be injected into the sensors 201 and 202 disposed in the second display area CA as much as the resolution of the plurality of second pixels disposed in the second display area CA is lowered. However, it is not necessarily limited thereto, and if the second display area CA has sufficient light transmissivity or an appropriate noise compensation algorithm can be implemented, the resolution of the first display area DA and the resolution of the second display area CA can be the same.

The second display area CA can be an area where the sensors 201 and 202 are disposed. Since the second display area CA is an area overlapped with various sensors, it can have a smaller area than the first display area DA, which outputs most of the image.

The sensors 201 and 202 can include at least one of an image sensor, a proximity sensor, an illuminance sensor, a gesture sensor, a motion sensor, a fingerprint recognition sensor, and a biometric sensor. Illustratively, the first sensor 201 can be an infrared sensor and the second sensor 202 can be an image sensor that captures images or videos, but is not limited thereto.

Referring to FIGS. 2A to 2D, the second display area CA can be disposed at various positions where light is incident. Illustratively, the second display area CA can be disposed at an upper left side of the display area, as shown in FIG. 2A. In addition, as shown in FIG. 2B, the second display area CA can be disposed on the upper right side of the display area. Further, as shown in FIG. 2C, the second display area CA can be entirely disposed on the top of the display area. In addition, as shown in FIG. 2D, the width of the second display area CA can be variously modified. However, the position of the second display area CA is not necessarily limited to the position shown in FIGS. 2A to 2D. For example, the second display area CA can be disposed in the center or lower end of the display area.

Hereinafter, the first display area DA can be described as a display area and the second display area CA can be described as an imaging area.

Referring to FIGS. 3 and 4, the display area DA and the imaging area CA can include a pixel array in which pixels into which pixel data is written are disposed. The number of pixels per inch (PPI) of the imaging area CA can be lower than that of the display area DA in order to secure the light transmissivity of the imaging area CA.

The pixel array of the display area DA can include a pixel area (first pixel area) in which a plurality of pixels having a high PPI are disposed. In addition, the pixel array of the imaging area CA can include a pixel area (second pixel area) in which a plurality of pixel groups having a relatively low PPI are disposed by being spaced apart by a light-transmission area. In the imaging area CA, an external light can pass through the display panel 100 through a light-transmission area having high light transmissivity and can be transmitted to a sensor on the rear surface the display panel 100.

Since both the display area DA and the imaging area CA include pixels, an input image can be reproduced on the display area DA and the imaging area CA.

Each of the pixels of the display area DA and the imaging area CA can include sub-pixels having different colors in order to implement color of an image. The sub-pixels can include red sub-pixel (hereinafter referred to as "R sub-pixel"), green sub-pixel (hereinafter referred to as "G sub-pixel"), and blue sub-pixel (hereinafter referred to as "B sub-pixel"). Each of the pixels P can further include a white sub-pixel (hereinafter referred to as "W sub-pixel"). Further, each of the sub-pixels can include a pixel circuit and a light emitting device OLED. Here, the sub-pixels can be referred to as a first sub-pixel, a second sub-pixel, and a third sub-pixel.

The imaging area CA can include pixels, and the pixels can display an input image by writing pixel data of an input image in a display mode. In this case, since the optical devices 200 are disposed on the rear surface of the display panel 100 to be overlapped with the imaging area CA, the display area of the screen is not limited by the optical devices 200. Accordingly, the display device of the present invention can realize a full-screen display by enlarging the display area of the screen and increase the degree of freedom in screen design.

A camera module can be provided as the optical device 200, and the camera module can capture an external image in an imaging mode and output photo or moving image data. A lens of the camera module can face the imaging area CA. In addition, the external light can be incident to a lens of the camera module through the imaging area CA, and the lens can condense light onto an image sensor omitted from the drawings. Accordingly, the camera module can output photo or moving image data by capturing an external image in the imaging mode.

In addition, the camera module provided as the optical device 200 can be an infrared camera including an infrared sensor 201. Here, the infrared camera captures dot beams of infrared wavelengths focused on a person's face. In addition, the infrared camera can generate facial pattern data by converting light of an infrared wavelength passing through the display panel 100 into electrical signals and converting them into digital data. Accordingly, when the infrared-rays irradiated from an infrared illuminator are irradiated to the user's face and the infrared-rays reflected from the face are received by the infrared camera, a biometric authentication module of a host system processes the user's authentication. In this case, the infrared illuminator can enable face recognition even in a dark environment by using a flood illuminator that generates an infrared (IR) flash.

Meanwhile, in order to secure the light transmissivity, some pixels can be removed from the imaging area CA compared to the display area DA. In addition, a picture quality compensation algorithm to compensate for the luminance and color coordinates of the pixels disposed in the imaging area CA due to the removed pixels can be applied to the display device.

In the present disclosure, low-resolution pixels can be disposed in the imaging area CA. Therefore, since the display area of the screen is not limited due to the camera module, a full-screen display can be implemented.

The display panel 100 has a width in the X-axis direction, a length in the Y-axis direction, and a thickness in the Z-axis direction. Here, the width and length of the display panel 100 can be set to various design values depending on application fields of the display device. In addition, the X-axis direction can mean a width direction or a horizontal direction, the Y-axis direction can mean a longitudinal direction or a vertical direction, and the Z-axis direction can mean a vertical direction, a stacking direction, or a thickness direction. Here, the X-axis direction, the Y-axis direction, and the Z-axis direction can be perpendicular to each other, but can also mean different directions that are not perpendicular to each other. Accordingly, each of the X-axis direction, the Y-axis direction, and the Z-axis direction can be described as one of a first direction, a second direction, and a third direction. Further, the plane extended in the X-axis direction and the Y-axis direction can mean a horizontal plane.

The display panel 100 can include a circuit layer 12 disposed on the substrate 10 and a light emitting element layer 14 disposed on the circuit layer 12. In addition, the display panel 100 can include an encapsulation layer 16 disposed on the light emitting element layer 14, a touch sensor layer 18 disposed on the encapsulation layer 16 and a color filter layer 20 disposed on the touch sensor layer 18.

The substrate 10 can be formed of an insulating material or a material having flexibility. For example, the substrate 10 can be made of glass, metal, or plastic, but is not limited thereto.

The circuit layer 12 can include a pixel circuit connected to wirings such as data lines, gate lines, and power lines, a gate driver connected to the gate lines, and the like. Further, the circuit layer 12 can include transistors implemented with thin film transistors (TFTs) and circuit elements such as capacitors or the like. Here, the wirings and circuit elements of the circuit layer 12 can be implemented with a plurality of insulating layers, two or more metal layers separated with the insulating layer interposed therebetween, and an active layer including a semiconductor material.

The light emitting element layer 14 can include a light emitting element driven by a pixel circuit. Here, the light emitting element can be implemented with an organic light emitting diode (OLED). The OLED can include an organic compound layer formed between an anode and a cathode. The organic compound layer includes a hole injection layer (HIL), a hole transport layer (HTL), an emission layer (EML), an electron transport layer (ETL), and an electron injection layer (EIL), but is not limited thereto. When a voltage is applied to an anode and a cathode of the OLED, the holes passing through the hole transport layer (HTL) and the electrons passing through the electron transport layer (ETL) can be moved to the light emitting layer (EML) to form excitons and emit visible light from the light emitting layer (EML).

The light emitting element layer 14 can further include a color filter array disposed on the pixels to selectively transmit red, green, and blue wavelengths.

The light emitting element layer 14 can be covered by a protective film, and the protective film can be covered by an encapsulation layer. Here, the protective film can have a structure in which organic films and inorganic films are alternately stacked. In this case, the inorganic film can block penetration of moisture or oxygen. In addition, the organic film can planarize the surface of the inorganic film. When the organic film and the inorganic film are stacked in multiple layers, a movement path of moisture or oxygen is longer than that of a single layer, so that the penetration of moisture/oxygen affecting the light emitting element layer 14 can be effectively blocked.

The encapsulation layer 16 covers the light emitting element layer 14 so as to seal the circuit layer 12 and the light emitting element layer 14. Here, the encapsulation layer 16 can have a multi-insulation film structure in which the organic film and the inorganic film are alternately stacked. In this case, the inorganic film blocks penetration of moisture or oxygen. In addition, the organic film planarizes the surface of the inorganic film. When the organic film and the inorganic film are stacked in multiple layers, the movement path of moisture or oxygen is longer than that of a single layer, so that the penetration of moisture/oxygen affecting the light emitting element layer 14 can be effectively blocked.

The touch sensor layer 18 can include capacitive touch sensors that sense a touch input based on a change in capacitance before and after the touch input. The touch sensor layer 18 can include metal wiring patterns and insulating films forming capacitance of the touch sensors. The insulating films can insulate portions in which the metal wiring patterns are intersected and planarize the surface of the touch sensor layer.

A polarizing plate omitted in the drawing can be adhered on the touch sensor layer 18. The polarizing plate can improve visibility and contrast ratio by converting polarization of external light reflected by the metal patterns of the circuit layer 12. Here, the polarizing plate can be implemented as a polarizing plate in which a linear polarizing plate and a phase retardation film are bonded together or a circular polarizing plate. Further, a cover glass omitted from the drawings can be adhered on the polarizing plate.

The color filter layer 20 can be formed on the touch sensor layer 18.

The color filter layer 20 can include red, green, and blue color filters. In addition, the color filter layer 20 can further include a black matrix pattern. The color filter layer 20 can absorb some wavelengths of light reflected from the circuit layer 12 to replace the role of a polarizing plate and increase color purity. In this embodiment, the color filter layer 20 having higher light transmissivity than that of the polarizing plate can be applied to the display panel 100 to improve the light transmissivity of the display panel 100 and to improve the thickness and flexibility of the display panel 100. A cover glass omitted in the drawings can be adhered on the color filter layer 20.

The color filter layer 20 can include an organic film covering the color filter and the black matrix pattern. An extended portion of the organic film can cover the remaining inorganic film or the substrate 10 in the bezel area, for example, the edge area of the display panel 100.

Referring to FIG. 4, the display area DA can include unit pixels PIX1 and PIX2 arranged in a matrix form. Each of the unit pixels PIX1 and PIX2 can be implemented as a real-type pixel in which R, G, and B sub-pixels of three primary colors are configured as one pixel. Here, a first pixel and a second pixel disposed in the display area can be formed by combining unit pixels PIX1 and PIX2.

Each of the unit pixels PIX1 and PIX2 can further include a W sub-pixel omitted from the drawings. In addition, two sub-pixels can be configured as one pixel by using a sub-pixel rendering algorithm. For example, the first unit pixel PIX1 can be composed of R and G sub-pixels, and the second unit pixel PIX2 can be composed of B and G sub-pixels. Insufficient color representation in each of the unit pixels PIX1 and PIX2 can be compensated for by an average value of corresponding color data between pixels adjacent to each other.

Figure 5A:
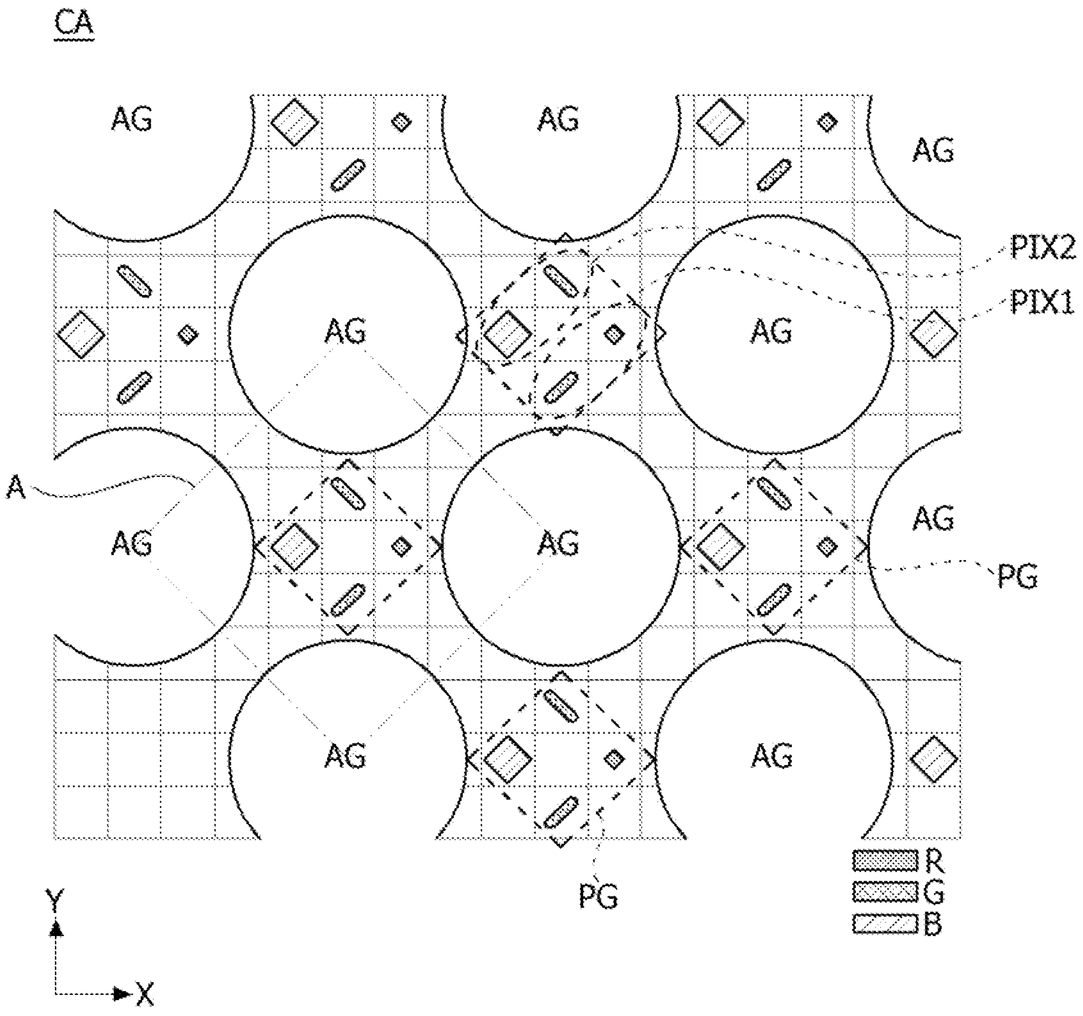
FIG. 5A is a diagram illustrating pixels disposed in a second display area of a display panel and a light-transmission area according to one embodiment of the present disclosure.
Figure 5B:
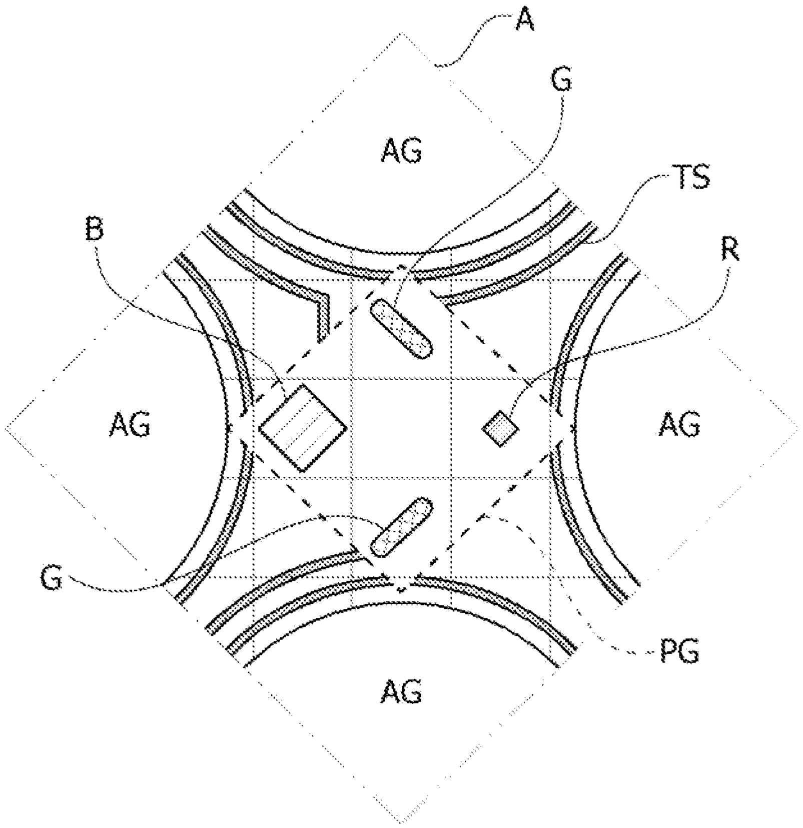
FIG. 5B is an enlarged view of a portion A in FIG. 5A.

FIG. 5A is a diagram illustrating pixels disposed in a second display area of a display panel and a light-transmission area according to one embodiment of the present disclosure, and FIG. 5B is an enlarged view of a portion A in FIG. 5A.

Referring to FIGS. 5A and 5B, a plurality of light-transmission area areas AG can be disposed between a plurality of second pixels. In detail, an imaging area CA can include pixel groups PG spaced apart by a predetermined distance and the light-transmission area AG disposed between the pixel groups PG adjacent to each other. The external light can be received by a lens of the camera module through the light-transmission area AG. The pixel groups PG can be spaced apart from each other within the pixel area.

The light-transmission area AG can include transparent materials having high light transmissivity without metal so that light can be incident with minimal light loss. The light-transmission area AG can be made of transparent insulating materials without including metal wirings or pixels. Accordingly, the light transmissivity of the imaging area CA can increase as the light-transmission area AG is larger.

One or two pixels can be included in the pixel group PG. Each of the pixels of the pixel group can include two to four sub-pixels. For example, one pixel in the pixel group can include R, G, and B sub-pixels or two sub-pixels, and can further include a W sub-pixel.

A distance between the light-transmission areas AG can be smaller than an interval (pitch) between the pixel groups PG. An interval between sub-pixels can be smaller than the interval between the pixel groups PG.

The shape of the light-transmission area AG is illustrated as circular, but is not limited thereto. For example, the light-transmission area AG can be designed in various shapes such as a circular shape, an elliptical shape, and a polygonal shape.

All of the metal electrode material in the light-transmission area AG can be removed. Accordingly, the wirings TS of the pixels can be disposed outside the light-transmission area AG. Therefore, light can be effectively incident through the light-transmission area AG. However, it is not necessarily limited thereto, and a metal electrode material can remain in some areas of the light-transmission area AG.

Figure 6:
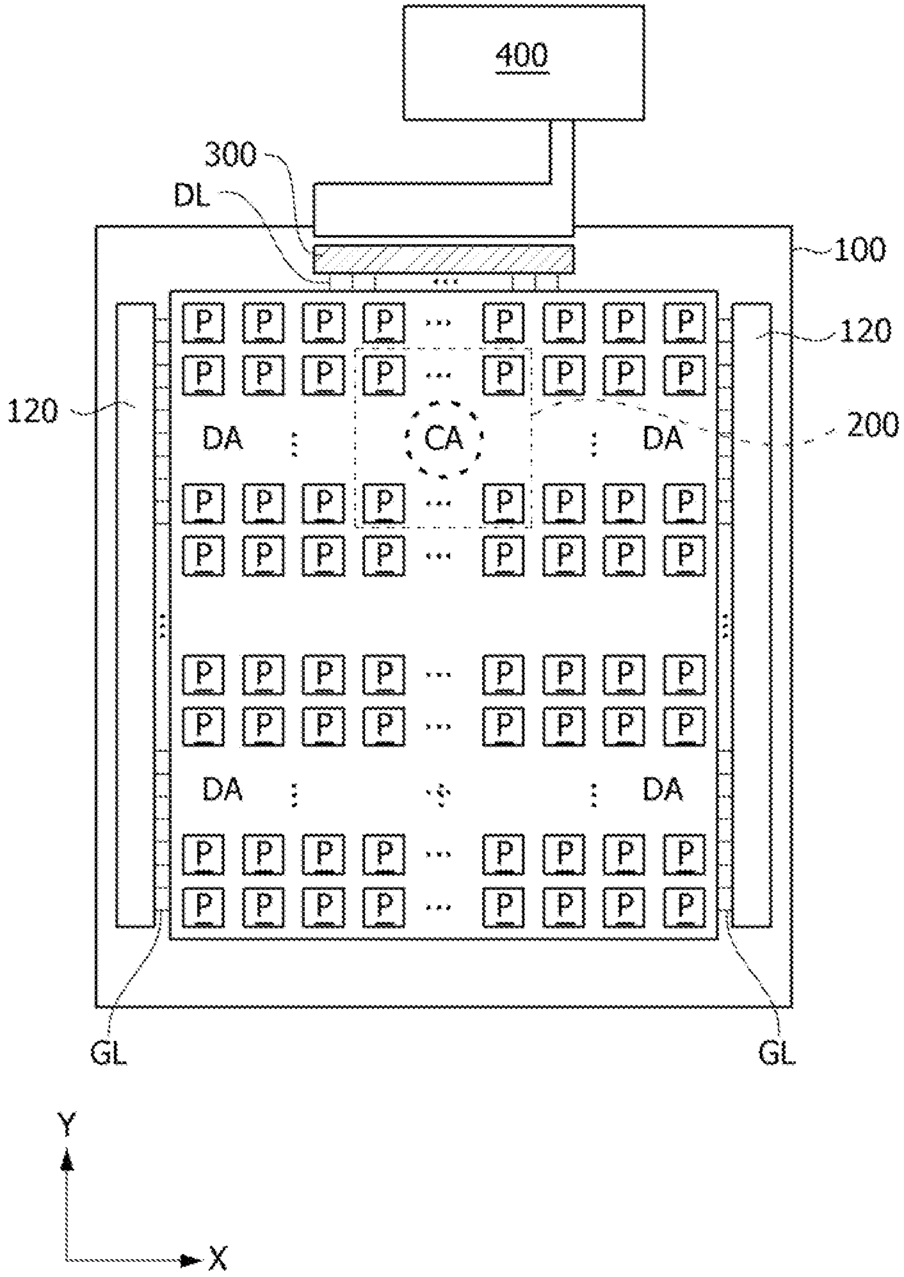
FIG. 6 is a diagram illustrating a display panel and a display panel driver according to an embodiment of the present disclosure.

FIG. 6 is a diagram illustrating a display panel and a display panel driver according to an embodiment of the present disclosure.

Referring to FIG. 6, the display device can include a display panel 100 having a pixel array disposed on a screen, a display panel driver, and the like.

The pixel array of the display panel 100 can include data lines DL, gate lines GL crossing the data lines DL, and pixels P connected to data lines DL and the gate lines GL and arranged in a matrix form. The pixel array can further include power wirings such as VDD line PL1, Vini line PL2, and VSS line PL3 shown in FIG. 7.

The pixel array can be divided into a circuit layer 12 and a light emitting element layer 14 as shown in FIG. 3. Further, a touch sensor array can be disposed on the light emitting element layer 14. Here, each of the pixels of the pixel array can include two to four sub-pixels as described above. Each of the sub-pixels can include a pixel circuit disposed on the circuit layer 12.

A screen on which an input image is reproduced on the display panel 100 can include a display area DA and an imaging area CA.

Each of the sub-pixels of the display area DA and the imaging area CA can include a pixel circuit. The pixel circuit can include a driving element for supplying current to the light emitting element OLED, a plurality of switch elements for sampling the threshold voltage of the driving element and switching the current path of the pixel circuit, a capacitor for maintaining the gate voltage of the driving element, and the like. In this case, the pixel circuit can be disposed below the light emitting element.

The imaging area CA can include a light-transmission area AG disposed between pixel groups and a camera module disposed under the imaging area CA. The camera module photoelectrically can convert light incident through the imaging area CA in imaging mode using an image sensor, convert pixel data of an image outputted from the image sensor into digital data, and output captured image data.

The display panel driver can write pixel data of an input image into the pixels P. The pixels P can be interpreted as a pixel group including a plurality of sub-pixels.

The display panel driver can include a data driver that supplies a data voltage of pixel data to the data lines DL and a gate driver 120 that sequentially supplies gate pulses to the gate lines GL. Further, the data driver can be integrated into the drive IC 300. In addition, the display panel driver can further include a touch sensor driver omitted from the drawings.

The drive IC 300 can be bonded on the display panel 100. The drive IC 300 receives pixel data of an input image and a timing signal from the host system 200, supplies a data voltage of the pixel data to pixels, and synchronizes the data driver and the gate driver 120.

The drive IC 300 can be connected to the data lines DL through data output channels to supply data voltages of pixel data to the data lines DL. The drive IC 300 can output a gate timing signal for controlling the gate driver 120 through gate timing signal output channels.

The gate driver 120 can include a shift register formed on a circuit layer of the display panel 100 together with a pixel array. The shift register of the gate driver 120 can sequentially supply gate signals to the gate lines GL under the control of the timing controller. The gate signal can include a scan pulse and an EM pulse of an emission signal.

The host system 400 can be implemented with an application processor (AP). The host system 400 can transmit pixel data of an input image to the drive IC 300 through a mobile industry processor interface (MIPI). The host system 400 can be connected to the drive IC 300 through a printed circuit, for example, a flexible printed circuit (FPC).

Meanwhile, the display panel 100 can be implemented with a flexible panel applicable to a flexible display.

The flexible panel can be made of a so-called "plastic OLED panel". The plastic OLED panel can include a back plate and a pixel array on an organic thin film adhered on the back plate. A touch sensor array can be formed over the pixel array.

The back plate can be a polyethylene terephthalate (PET) substrate. The pixel array and the touch sensor array can be formed on the organic thin film. The back plate can block moisture permeation toward the organic thin film so that the pixel array is not exposed to humidity.

The organic thin film can be a polyimide (PI) substrate. A multi-layered buffer film can be formed on the organic thin film with an insulating material. Further, the circuit layer 12 and the light emitting element layer 14 can be stacked on the organic thin film.

In the display device of the present disclosure, a pixel circuit and a gate driver disposed on the circuit layer 12 can include a plurality of transistors. The transistors can be implemented with oxide thin film transistors (TFTs) including an oxide semiconductor, low temperature poly silicon (LTPS) TFTs including LTPS, and the like. In addition, each of the transistors can be implemented as a p-channel TFT or an n-channel TFT.

The transistor is a three-electrode element including a gate, a source, and a drain. The source is an electrode that provides carriers to the transistor. The carriers in the transistor can start to flow from the source. The drain is an electrode through which the carriers are discharged from the transistor to the outside.

In the transistor, carriers flow from the source to the drain. In the case of an n-channel transistor, carriers are electrons, and thus a source voltage is lower than a drain voltage so that the electrons flow from the source to the drain. In the n-channel transistor, current flows from the drain to the source.

In the case of a p-channel transistor (PMOS), carriers are holes, and thus a source voltage is higher than a drain voltage so that the holes flow from the source to the drain. In the p-channel transistor, since the holes flow from the source to the drain, current flows from the source to the drain. It should be noted that the source and drain of the transistor are not fixed in position. For example, the source and drain are interchangeable depending on the applied voltage. Accordingly, it is not limited by the source and drain of the transistor. In the following description, the source and the drain of the transistor will be referred to as a first electrode and a second electrode.

A gate pulse swings between a gate-on voltage and a gate-off voltage. The gate-on voltage is set to be higher than a threshold voltage of the transistor, and the gate-off voltage is set to be lower than the threshold voltage of the transistor.

The transistor is turned on in response to the gate-on voltage, but can be turned off in response to the gate-off voltage. In the case of an n-channel transistor, the gate-on voltage can be a gate-high voltage VGH, and the gate-off voltage can be a gate-low voltage VGL. In the case of a p-channel transistor, the gate-on voltage can be a gate-low voltage VGL, and the gate-off voltage can be a gate-high voltage VGH.

A driving element of the pixel circuit can be implemented with a transistor. The electrical characteristics of the driving element should be uniform among all pixels, but there can be differences between the pixels due to a process variation and element characteristic variation, and the difference can be varied as a display driving time elapses.

To compensate for variations in electrical characteristics of the driving elements, the display device can include an internal compensation circuit and an external compensation circuit. The internal compensation circuit can be added to the pixel circuit in each of the sub-pixels to sample the threshold voltage (Vth) and/or mobility (u) of the driving element, which varies depending on electrical characteristics of the driving element, and compensate for the change in real time.

The external compensation circuit can transmit a threshold voltage and/or mobility of the driving element sensed through a sensing line connected to each of the sub-pixels to an external compensation part. The compensation part of the external compensation circuit can compensate for a change in electrical characteristics of the driving element by modulating pixel data of an input image by reflecting a sensing result.

A voltage of a pixel that varies depending on electrical characteristics of an external compensation driving element can be sensed and data of an input image in an external circuit based on the sensed voltage can be modulated, such that a deviation in electrical characteristics of a driving element between pixels can be compensated for.

Figure 7:
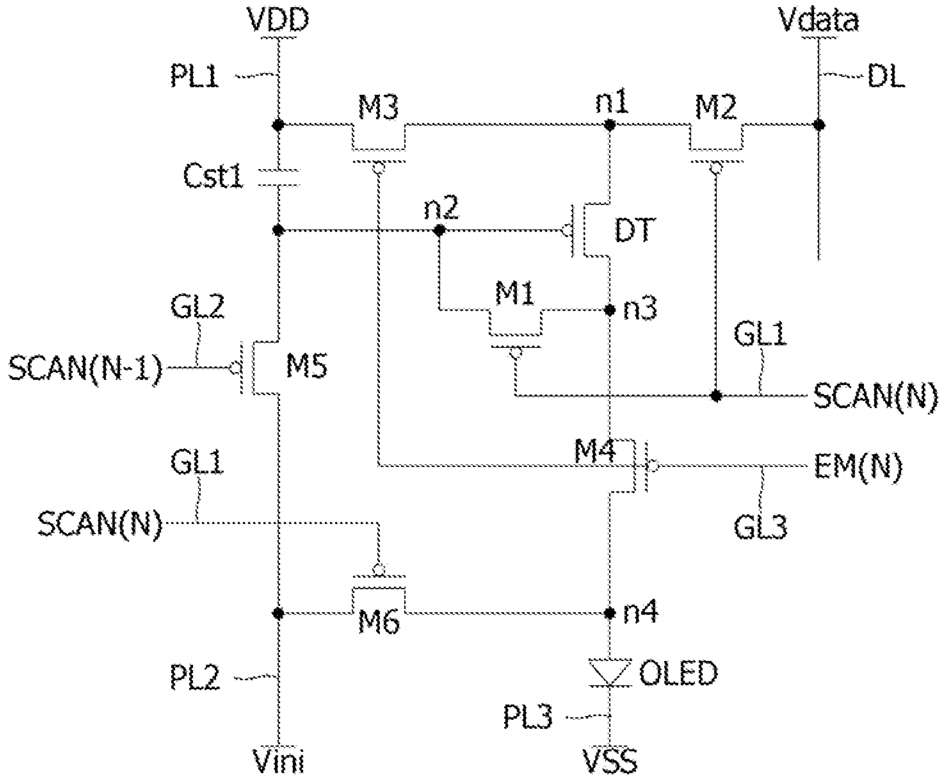
FIG. 7 is a circuit diagram illustrating one example of a pixel circuit according to an example of the present disclosure.

FIG. 7 is a circuit diagram illustrating one example of a pixel circuit.

The pixel circuit shown in FIG. 7 can be equally applied to the pixel circuits of a display area DA and an imaging area CA, e.g., of any display device of the present disclosure.

Referring to FIG. 7, the pixel circuit can include a light emitting element OLED, a driving element DT for supplying current to the light emitting element OLED, and an internal compensation circuit for sampling the threshold voltage Vth of the driving element DT and compensating for the gate voltage of the driving element DT by the threshold voltage Vth of the driving element DT using a plurality of switch elements M1 to M6. Each of the driving element DT and the switch elements M1 to M6 can be implemented as a p-channel TFT.

The light emitting element OLED can include an organic compound layer formed between an anode and a cathode. The organic compound layer can include, but is not limited to, a hole injection layer (HIL), a hole transport layer (HTL), a light emitting layer (EML), an electron transport layer (ETL), an electron injection layer (EIL), and the like. When a voltage is applied to the anode and cathode electrodes of the OLED, holes passing through the hole transport layer (HTL) and electrons passing through the electron transport layer (ETL) are moved to the light emitting layer (EML) to form excitons, and the visible light can be emitted from the light emitting layer (EML).

The anode electrode of the light emitting element OLED can be connected to a fourth node n4 between the fourth and sixth switch elements M4 and M6. The fourth node n4 can be connected to the anode of the light emitting element OLED, a second electrode of the fourth switch element M4, and a second electrode of the sixth switch element M6. The cathode electrode of the light emitting element OLED can be connected to VSS line PL3 to which the low potential power supply voltage VSS is applied. The light emitting element OLED can emit light with the current Ids flowing depending on the gate-source voltage Vgs of the driving element DT. A current path of the light emitting element OLED can be switched by the third and fourth switch elements M3 and M4.

A storage capacitor Cst1 can be connected between the VDD line PL1 and the second node n2. A data voltage Vdata compensated for by the threshold voltage Vth of the driving element DT can be charged in the storage capacitor Cst1. Since the data voltage Vdata in each of the sub-pixels is compensated for by the threshold voltage Vth of the driving element DT, a characteristic deviation of the driving element DT in the sub-pixels can be compensated for.

The first switch element M1 can be turned on in response to a gate-on voltage VGL of an N-th scan pulse SCAN(N) to connect the second node n2 and the third node n3. The second node n2 can be connected to a gate electrode of the driving element DT, a first electrode of the storage capacitor Cst1, and a first electrode of the first switch element M1. The third node n3 can be connected to the second electrode of the driving element DT, the second electrode of the first switch element M1, and a first electrode of the fourth switch element M4. The gate electrode of the first switch element M1 is connected to a first gate line GL1 to receive the N-th scan pulse SCAN(N). The first electrode of the first switch element M1 can be connected to the second node n2, and the second electrode of the first switch element M1 can be connected to the third node n3.

The first switch element M1 is turned on only during one very short horizontal period (1H) in which the Nth scan signal SCAN(N) is generated as the gate-on voltage VGL in one frame period and maintains a turned-off state for approximately one frame period. For this reason, a leakage current can be generated in the turned-off state of the first switch element M1.

The second switch element M2 can be turned on in response to the gate-on voltage VGL of the N-th scan pulse SCAN(N) to supply the data voltage Vdata to the first node n1. The gate electrode of the second switch element M2 is connected to the first gate line GL1 to receive the N-th scan pulse SCAN(N). A first electrode of the second switch element M2 can be connected to the first node n1. The second electrode of the second switch element M2 can be connected to the data line DL to which the data voltage Vdata is applied. The first node n1 can be connected to the first electrode of the second switch element M2, the second electrode of the third switch element M3, and the first electrode of the driving element DT.

The third switch element M3 can be turned on in response to the gate-on voltage VGL of the light emitting signal EM(N) to connect the VDD line PL1 to the first node n1. The gate electrode of the third switch element M3 can be connected to the third gate line GL3 to receive the light emitting signal EM(N). A first electrode of the third switch element M3 can be connected to the VDD line PL1. A second electrode of the third switch element M3 can be connected to the first node n1.

The fourth switch element M4 can be turned on in response to the gate-on voltage VGL of the light emitting signal EM(N) to connect the third node n3 to the anode of the light emitting element OLED. The gate electrode of the fourth switch element M4 is connected to the third gate line GL3 to receive the light emitting signal EM(N). The first electrode of the fourth switch element M4 can be connected to the third node n3, and the second electrode thereof can be connected to the fourth node n4.

The fifth switch element M5 can be turned on in response to the gate-on voltage VGL of the N−1th scan pulse SCAN (N−1) to connect the second node n2 to the Vini line PL2. The gate electrode of the fifth switch element M5 is connected to the second gate line GL2 to receive the N−1th scan pulse SCAN(N−1). The first electrode of the fifth switch element M5 can be connected to the second node n2, and the second electrode thereof can be connected to the Vini line PL2.

The sixth switch element M6 can be turned on in response to the gate-on voltage VGL of the N-th scan pulse SCAN(N) to connect the Vini line PL2 to the fourth node n4. The gate electrode of the sixth switch element M6 is connected to the first gate line GL1 to receive the N-th scan pulse SCAN(N). A first electrode of the sixth switch element M6 can be connected to the Vini line PL2, and a second electrode thereof can be connected to the fourth node n4.

The driving element DT can drive the light emitting element OLED by adjusting the current Ids flowing through the light emitting element OLED depending on the gate-source voltage Vgs. The driving element DT can include a gate connected to the second node n2, a first electrode connected to the first node n1, and a second electrode connected to the third node n3.

Figure 8:
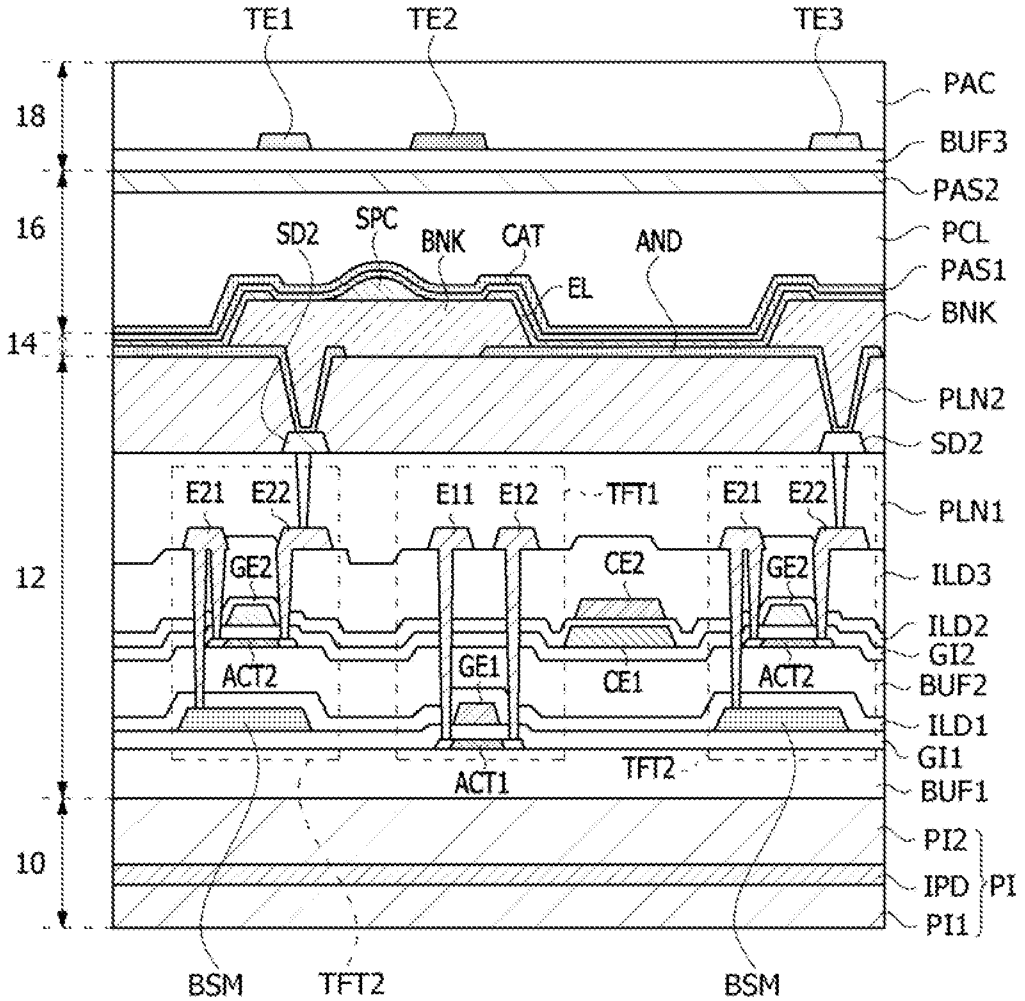
FIG. 8 is a cross-sectional view illustrating in detail a cross-sectional structure of a pixel area disposed in a first display area in a display panel according to one embodiment of the present disclosure.
Figure 9:
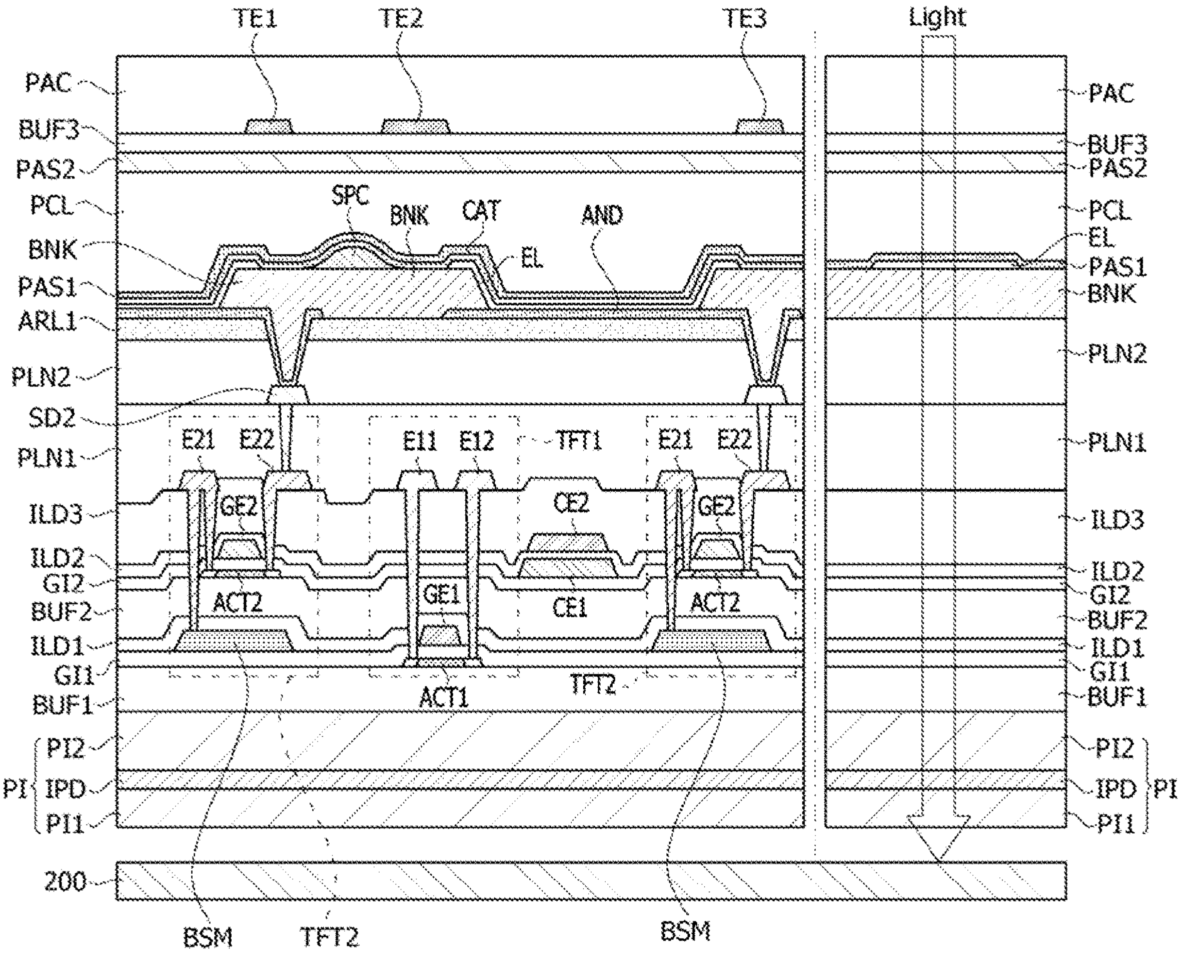
FIG. 9 is a diagram illustrating cross-sectional structures of a pixel area and a light-transmission area disposed in a second display area in a display device according to one embodiment of the present disclosure.

FIG. 8 is a detailed cross-sectional view of a cross-sectional structure of a pixel area disposed in a first display area in a display panel according to one embodiment of the present disclosure, and FIG. 9 is a diagram showing a cross-sectional structure of a pixel area and a light-transmission area disposed in a second display area in the display device according to one embodiment of the present disclosure.

FIG. 8 is a diagram illustrating a cross-sectional structure of a pixel area in a display device according to one embodiment of the present disclosure. Here, it should be noted that the cross-sectional structure of the pixel area is not limited to that of FIG. 8. In FIG. 8, TFT represents a driving element DT of the pixel circuit. In detail, “TFT1” is a first TFT that is one of LTPS TFTs disposed in the display area, and “TFT2” is a second TFT that is one of oxide TFTs disposed in the display area.

Referring to FIG. 8, a plurality of sub-pixel circuits and wires connected to the pixel circuits are disposed in the display area DA of the display panel 100. Here, the pixel circuits of the display area include a pixel circuit of a red sub-pixel driving a red light emitting element, a pixel circuit of a green sub-pixel driving a green light emitting element, and a pixel circuit of a blue sub-pixel driving a blue light emitting element. Further, the display area can be separated into a plurality of circuit areas along the X-axis direction of the display panel 100.

The substrate PI can include first and second substrates PI1 and PI2. In addition, an inorganic film IPD can be formed between the first substrate PI1 and the second substrate PI2. In this case the inorganic film IPD blocks moisture permeation. Here, since the substrate PI can be formed of polyimide, it can be referred to as a PI substrate, and the first and second substrates PI1 and PI2 can be referred to as first and second PI substrates.

The first buffer layer BUF1 can be formed on the second substrate PI2. The first buffer layer BUF1 can be formed of a multi-layered insulating layer in which two or more oxide layers $SiO_2$ and nitride layers SiNx are stacked. A first semiconductor layer is formed on the first buffer layer BUF1. The first semiconductor layer can include a polysilicon semiconductor layer patterned in a photolithography process. The first semiconductor layer can include a polysilicon active pattern ACT1 forming a semiconductor channel in the first TFT TFT1.

A first gate insulating layer GI1 is deposited on the first buffer layer BUF1 to cover the active pattern ACT1 of the first semiconductor layer. The first gate insulating layer GI1 includes an inorganic insulating material layer. A first metal layer is formed on the first gate insulating layer GI1. The first metal layer is insulated from the first semiconductor layer by the first gate insulating layer GI1.

The first metal layer includes a single metal layer patterned in a photolithography process or metal patterns in which two or more metal layers are stacked. The first metal layer can include the gate electrode GE1 of the first TFT TFT1 and a light shield pattern BSM under the second TFT TFT 2.

A first interlayer insulating layer ILD1 is formed on the first gate insulating layer GI1 to cover the patterns of the first metal layer. The first interlayer insulating layer ILD1 includes an inorganic insulating material. A second buffer layer BUF2 is formed on the first interlayer insulating layer ILD1. The second buffer layer BUF2 includes a single layer or a multi-layer inorganic insulating material.

The second semiconductor layer includes an oxide semiconductor pattern ACT2 forming a semiconductor channel in the second TFT TFT2. The second gate insulating layer GI2 is deposited on the second buffer layer BUF2 to cover the active pattern ACT2 of the second semiconductor layer. The second gate insulating layer GI2 includes a single or multi-layered inorganic insulating material. A second metal layer is formed on the second gate insulating layer GI2. The second metal layer is insulated from the second semiconductor layer by the second gate insulating layer GI2.

The second metal layer includes a single metal layer patterned in a photolithography process or metal patterns in which two or more metal layers are stacked. The second metal layer includes a gate electrode GE2 of the second TFT TFT2 and a lower capacitor electrode CE1.

A second interlayer insulating layer ILD2 is formed on the second gate insulating layer GI2 to cover the patterns of the second metal layer. The second interlayer insulating layer ILD2 includes a single layer or a multi-layer inorganic insulating material. A third metal layer is formed on the second interlayer insulating layer ILD2. The third metal layer is insulated from the second metal layer by the second interlayer insulating layer ILD2.

The third metal layer includes a single metal layer patterned in a photolithography process or metal patterns in which two or more metal layers are stacked. The third metal layer includes an upper capacitor electrode CE2. The capacitor (Cst) of the pixel circuit is composed of the upper capacitor electrode CE2, the lower capacitor electrode CE1, and a dielectric layer therebetween, for example, the second interlayer insulating layer ILD2.

A third interlayer insulating layer ILD3 covering the patterns of the third metal layer is formed on the second interlayer insulating layer ILD2. The third interlayer insulating layer ILD3 includes a single layer or a multi-layer inorganic insulating material. A fourth metal layer is formed on the third interlayer insulating layer ILD3. The fourth metal layer is insulated from the second semiconductor layer by the second gate insulating layer GI2.

A fourth metal layer SD1 includes a single metal layer patterned in a photolithography process or metal patterns in which two or more metal layers are stacked. The fourth metal layer includes first and second electrodes E11 and E12 of the first TFT TFT1 and first and second electrodes E21 and E22 of the second TFT TFT2. The first and second electrodes E11 and E12 of the first TFT TFT1 is connected to a first active pattern ACT1 through a first contact hole passing through the insulating layers GI1, ILD1, BUF2, GI2, ILD2 and ILD3. The first and second electrodes E21 and E22 of the second TFT TFT2 are connected to a second active pattern ACT2 through a second contact hole passing through the insulating layers GI2, ILD2 and ILD3. The first electrode E21 of the second TFT TFT2 can be connected to the light shield pattern BSM through a third contact hole passing through the insulating layers ILD1, BUF2, GI2, ILD2 and ILD3. Here, a strong electric field can be generated in the metal patterns E11 to E22 of the fourth metal layer due to voltages swinging between a gate-on voltage and a gate-off voltage with a large voltage difference.

A first planarization layer PLN1 covers the metal patterns E11 to E22 of the fourth metal layer. The first planarization layer PLN1 thickly covers the display area DA of the circuit layer 12 with an organic insulating material. When the first planarization layer PLN1 is applied on the circuit layer 12, the organic insulating material flows to the edge of the display panel 100 and covers the side surface of the circuit layer 12 in the bezel area (BZ).

A fifth metal layer is formed on the first planarization layer PLN1. The fifth metal layer is insulated from the fourth metal layer by the first planarization layer PLN1. The fifth metal layer includes a single metal layer patterned in a photolithography process or metal patterns in which two or more metal layers are stacked. The fifth metal layer includes a metal pattern SD2 connecting the light emitting element to the second TFT TFT2. The metal pattern SD2 is connected to the second electrode E22 of the second TFT TFT2 through a fourth contact hole penetrating the first planarization layer PLN1.

A second planarization layer PLN2 is formed on the first planarization layer PLN1 to cover the metal patterns of the fifth metal layer. The second planarization layer PLN2 thickly covers the display area DA of the circuit layer 12 with an organic insulating material. A sixth metal layer is formed on the second planarization layer PLN2. The second planarization layer PLN2 planarizes the surface on which the sixth metal layer is formed.

The sixth metal layer includes a single metal layer patterned in a photolithography process or metal patterns in which two or more metal layers are stacked. The pattern of the sixth metal layer includes an anode electrode AND of the light emitting element. The anode electrode AND is in contact with the metal pattern SD2 connected to the second TFT TFT2 of the pixel circuits through the fifth contact hole penetrating the second planarization layer PLN2.

In the light emitting element layer 14, a bank BNK is formed on the second planarization layer PLN2 to cover the edge of the anode AND. In this case, the bank BNK is formed in a pattern that divides a light emitting area (or an opening area) through which light passes from each pixel to the outside. Accordingly, the bank BNK can be referred to as a pixel-defining film. The bank BNK can be patterned in a photolithography process by including an organic insulating material having photosensitivity. Further, a spacer SPC having a predetermined height can be formed on the bank BNK. In this case, the bank BNK and the spacer SPC can be integrated with the same organic insulating material. Further, the spacer SPC secures a gap between a fine metal mask (FMM) and the anode electrode AND so that the FMM is not in contact with the anode electrode AND during a deposition process of the light emitting device formed of an organic compound.

A seventh metal layer used as a cathode electrode CAT of the light emitting element is formed on the light emitting element implemented with the bank BNK and an organic compound layer EL. The seventh metal layer is connected between sub-pixels in the display area DA. Here, the organic compound layer EL can be referred to as a light emitting layer or an electroluminescent layer.

The encapsulation layer 16 includes multiple insulating layers covering the cathode electrode CAT of the light emitting element. The multiple insulating layers include a first inorganic insulating layer PAS1 covering the cathode electrode CAT, a thick organic insulating layer PCL covering the first inorganic insulating layer PAS1, and a second inorganic insulating layer PAS2 covering the organic insulating layer PCL.

The touch sensor layer 18 includes a third buffer layer BUF3 covering the second inorganic insulating layer PAS2, sensor electrode wirings TE1 to TE3 formed on the third buffer layer BUF3, and an organic insulating layer PAC covering the sensor electrode wirings TE1 to TE3.

Referring to FIG. 9, the second display area can include a pixel area and a light-transmission area. Further, the pixel area of the second display area has the same structure as the pixel area shown in FIG. 8. However, the pixel area of the second display area differs from the pixel area of the first display area in that it includes the anti-reflection layer ARL1 disposed between the planarization layer of the circuit layer 12 and the anode electrodes AND of the light emitting element layer 14. Here, the planarization layer disposed under the anti-reflection layer ARL1 can be the second planarization layer PLN2.

The light-transmission area AG can include transparent media having high light transmissivity without metal so that light can be incident with minimal light loss. The light-transmission area AG can be formed of transparent insulating materials without including metal wirings or pixels. For example, compared to the pixel area, the metal wirings such as the anode electrode AND and the cathode electrode CAT may not be disposed in the light-transmission area AG. Further, the organic compound layer EL can be disposed in the light-transmission area AG.

Figure 10:
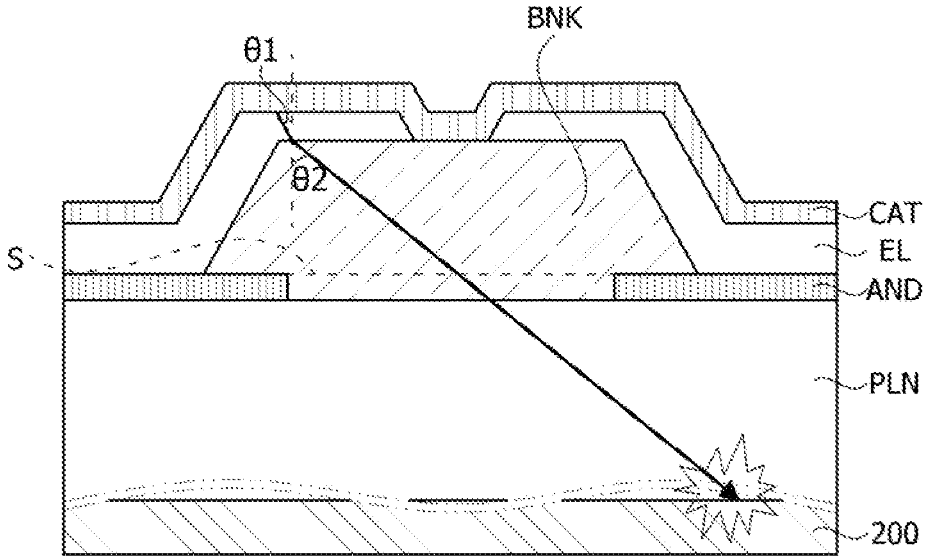
FIG. 10 is a diagram schematically illustrating a pixel area of a display device according to a comparative example.

FIG. 10 is a diagram schematically illustrating a pixel area of a display device according to a comparative example. FIG. 10 is a diagram showing a light path of light affecting the sensors 201 and 202 of the optical device 200, and parts of the substrate 10 and the circuit layer 12 are omitted. Further, an arrow shown in FIG. 10 can indicate a light path.

Referring to FIG. 10, the display device according to the comparative example can include a pixel area of a second display area and sensors 201 and 202 of the optical device 200 disposed to correspond to the second display area, and the pixel area of the second display area can include a bank BNK partitioning a light emitting element, an anode electrode AND of the light emitting element disposed spaced apart and disposed adjacent to each other, and a planarization layer PLN disposed under the anode electrode AND. As the anode electrodes AND are spaced apart from each other, a space S can be formed between the anode electrodes AND on a horizontal plane. The space S can be formed between an anode electrode of one sub-pixel and an anode electrode of another sub-pixel disposed adjacent to each other with the one sub-pixel. In this case, the space S can be disposed to be overlapped with the sensors 201 and 202 in the Z-axis direction.

The light generated in the light emitting element layer 14 affects the sensors 201 and 202 of the optical device 200 disposed under the planarization layer PLN through the space S. For example, in the case of an image sensor, crosstalk distortion can occur in an image due to the light. Alternatively, in the case of an infrared sensor, an error can occur in recognizing an object (such as a face) due to the light.

In detail, the light incident on the bank BNK at a first incident angle θ1 is refracted at the interface with the bank BNK at a second exit angle θ2. Further, the light refracted by the bank BNK is incident to the sensors 201 and 202 of the optical device 200 through the planarization layer PLN. Here, the first incident angle θ1 and the second exit angle θ2 are different due to the difference in refractive index. In this case, the refractive index of the bank BNK can be the same as that of the planarization layer PLN. For example, values n of the refractive index of the bank BNK and the refractive index of the planarization layer PLN can be 1.5. Further, the refractive index of the organic compound layer EL can be 1.8. Accordingly, the light refracted by the bank BNK affects the sensors 201 and 202 of the optical device 200 through the space S.

Therefore, the display device according to an embodiment of the present disclosure can include a light-path changing structure disposed in the second display area CA to minimize the influence of light reaching the optical device 200. Accordingly, the display device according to the embodiment of the present invention can improve the performance of the sensors 201 and 202 by minimizing the influence of light on the optical device through the light-path changing structure, and enables the low-power driving of the sensors.

Thus, the display device according to the embodiment of the present disclosure presents various embodiments of a light-path changing structure that improves light transmittance property, thereby minimizing the influence of light reaching the optical device 200 in the second display area CA.

Hereinafter, various embodiments of a display device according to an embodiment of the present disclosure will be described.

Figure 11:
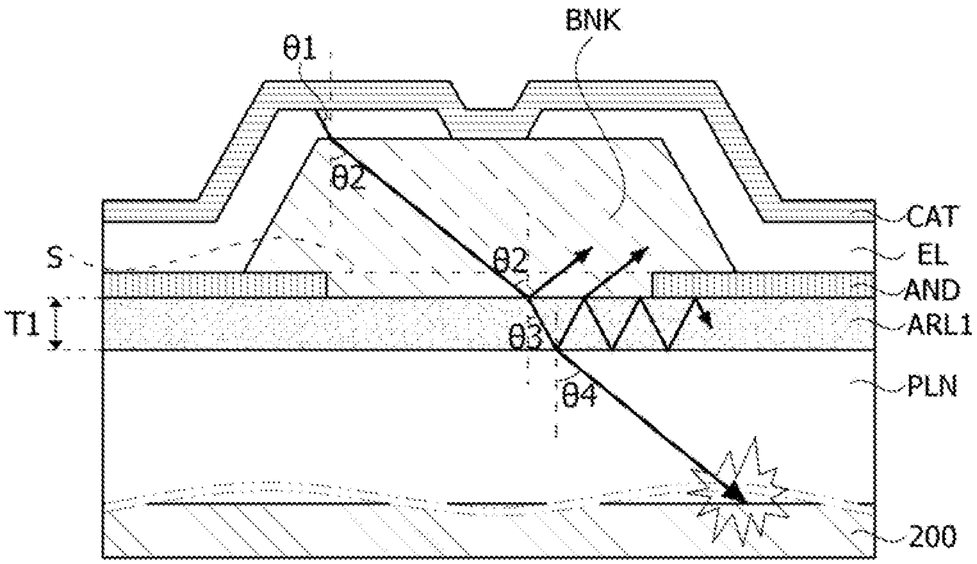
FIG. 11 is a diagram schematically illustrating a relationship between a light-path changing structure and a light path according to a first embodiment of the present disclosure.
Figure 12:
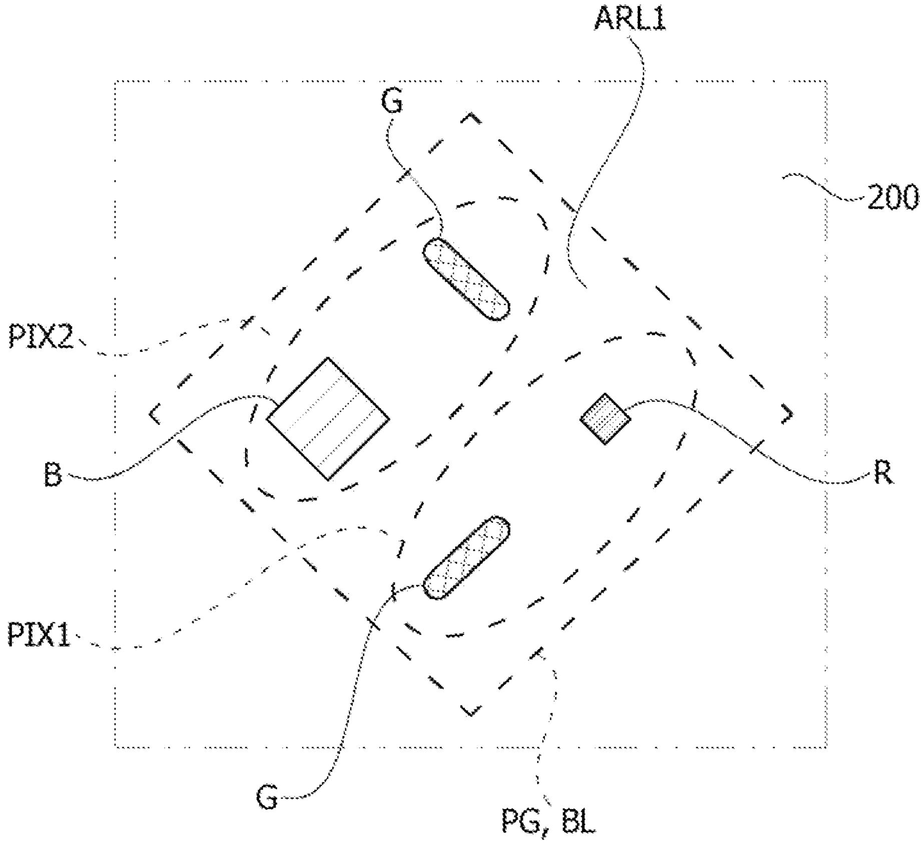
FIG. 12 is a diagram illustrating an arrangement relationship between a light-path changing structure and a pixel group according to the first embodiment.

FIG. 11 is a diagram schematically showing a relationship between a light-path changing structure and a light path according to the first embodiment, and FIG. 12 is a diagram showing an arrangement relationship between the light-path changing structure and a pixel group according to a first embodiment. FIG. 11 is a diagram in which parts of the substrate 10 and the circuit layer 12 are omitted to show a light path of light reaching the sensor. In addition, arrows shown in FIG. 11 can indicate light paths.

With reference to FIGS. 10 to 12, comparing the display device according to the first embodiment and the display device according to the comparative example, the display device according to the first embodiment is different in that an anti-reflection layer ARL1 having a different refractive index relative to the planarization layer PLN is disposed between the planarization layer PLN and the anode electrode AND of the light emitting element.

Therefore, the display device according to the first embodiment can minimize the influence of light reaching the optical device 200 by reflecting and refracting light directed to the optical device 200 through the space S by means of the anti-reflection layer ARL1.

Referring to FIGS. 11 and 12, the display device according to the first embodiment can include a pixel area of a second display area and sensors 201 and 202 of an optical device 200 disposed to correspond to the second display area, and provide an anti-reflection layer ARL1 having a different refractive index relative to the planarization layer PLN as a light-path changing structure according to the first embodiment, thereby minimizing the influence of light reaching the optical device 200.

The display device according to the first embodiment can include a bank BNK partitioning a light emitting element, an anode electrode AND of the light emitting element disposed spaced apart and disposed adjacent to each other, a planarization layer disposed under the anode electrode AND, and an anti-reflection layer ARL1 disposed between the planarization layer PLN and the anode electrode AND of the light emitting element. Further, as the anode electrodes AND are disposed to be spaced apart from each other, a space S can be formed between the anode electrodes AND on a horizontal plane, the bank BNK can be disposed in the space S, and the space S can be disposed to be overlapped with the bank BNK, as shown in FIG. 11. In this case, the space S and the bank BNK can be disposed to be overlapped with the anti-reflection layer ARL1 in the Z-axis direction. Here, the anode electrode AND disposed adjacent to each other on the same layer can be referred to as a first anode electrode (AND1) and a second anode electrode (AND2).

The anti-reflection layer ARL1 can be formed to have the same size as one pixel group PG representing the second pixel, and an area of the anti-reflection layer ARL1 corresponds to the boundary line BL of one pixel group PG, as shown in FIG. 12.

Therefore, since the anti-reflection layer ARL1 has a refractive index different from that of the bank BNK and the planarization layer PLN forming the boundary in the Z-axis direction, a part of light incident to the anti-reflection layer ARL1 through the space S can be reflected or refracted. Accordingly, a path of light directed to the optical device 200 through the space S is changed by means of the anti-reflection layer ARL1, thereby minimizing the influence of the light reaching the optical device 200. Here, the refractive index of the anti-reflection layer ARL1 is greater than that of the bank BNK and the planarization layer PLN. For example, when values n of the refractive index of the bank BNK and the refractive index of the planarization layer PLN is 1.5, a value n of the refractive index of the anti-reflection layer ARL1 is equal to or greater than 1.8. In addition, the refractive index of the anti-reflection layer ARL1 can be equal to the refractive index of the organic compound layer EL, or greater than the refractive index of the organic compound layer EL.

Hereinafter, with reference to FIG. 11, a light path of light directed to the optical device 200 through the space S will be described.

As the refractive indices of the organic compound layer EL and the bank BNK are different for each material, the light incident on the bank BNK at a first incident angle θ1 is refracted at a boundary surface between the organic compound layer EL and the bank BNK at a second exit angle θ2.

In addition, a part of the light incident on the anti-reflection layer ARL1 through the space S at the second incident angle θ2 is reflected by means of the anti-reflection layer ARL1, and another part is reflected at the boundary surface of the bank BNK and the anti-reflection layer ARL1 at a third exit angle θ3 and incident into the anti-reflection layer ARL1.

Further, a part of the light incident on the planarization layer PLN at the third incident angle θ3 is reflected by the planarization layer PLN, and another part is reflected at the boundary surface of the bank BNK, the anti-reflection layer ARL1, and the planarization layer PLN at a fourth exit angle θ4. In addition, still another part of the light is reflected and dissipated by the anode electrode AND and the boundary surface inside the anti-reflection layer ARL1.

Therefore, the light substantially reaching the optical device 200 can be minimized by means of the anti-reflection layer ARL1.

Meanwhile, a blocking rate of light directed to the optical device 200 through the space S can be adjusted depending on the refractive index and thickness of the anti-reflection layer ARL1. For example, the anti-reflection layer ARL1 can be formed to have a predetermined thickness T1 and a refractive index so that a blocking rate of light irradiated by a sub-pixel can be adjusted. For example, the refractive index of the anti-reflection layer ARL1 can be presented as a first factor of the light-path changing structure according to the first embodiment, and the thickness T1 of the anti-reflection layer ARL1 can be presented as a second factor.

FIG. 13 is a table showing blocking rates for each wavelength that is changed by a refractive index and thickness of the anti-reflection layer provided in the light-path changing structure according to the first embodiment.

Referring to FIG. 13, the blocking rate for each wavelength is different depending on the refractive index (n) of the anti-reflection layer ARL1. Accordingly, the display device according to the first embodiment can adjust the refractive index of the anti-reflection layer ARL1 in consideration of the influence of the wavelength reaching the optical device 200. For example, since the influence of each wavelength of light is different depending on the type of sensor disposed in the optical device 200, in consideration of this, the refractive index of the anti-reflection layer ARL1 can be adjusted. For example, in the case of an infrared sensor, since the effect of red light is great, in consideration of this, the refractive index of the anti-reflection layer ARL1 can be adjusted. Here, the anti-reflection layer ARL1 can be formed of a transparent material capable of forming a high refractive index, and can be formed of one or more of the compounds of silicon oxy nitride (SiON), silicon nitride (SiNx), silicon oxide (SiOx), titanium oxide (TiOx), and zirconium oxide (ZrOx), and tin oxide (SnOx).

In addition, the blocking rate for each wavelength is different depending on the thickness T1 of the anti-reflection layer ARL1. Accordingly, the display device according to the first embodiment can adjust the thickness T1 of the anti-reflection layer ARL1 in consideration of the influence of the wavelength reaching the optical device 200. For example, since the influence of each wavelength of light is different depending on the type of sensor disposed in the optical device 200, in consideration of this, the thickness T1 of the anti-reflection layer ARL1 can be adjusted. For example, in the case of an infrared sensor, since the influence of red light is great, in consideration of this, the thickness T1 of the anti-reflection layer ARL1 can be adjusted.

In addition, the display device according to the embodiment can optimize the area of the area of the anti-reflection layer ARL1 by presenting an arrangement relationship between the boundary line and the sub-pixel.

Figure 14:
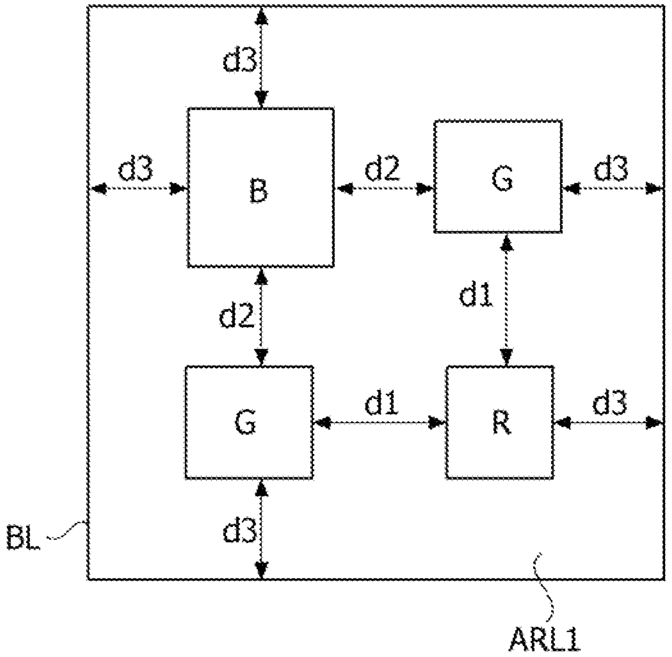
FIG. 14 is a diagram illustrating an arrangement relationship between a sub-pixel and a boundary line of a display device according to an embodiment of the present disclosure.

FIG. 14 is a diagram illustrating an arrangement relationship between sub-pixels and boundary lines of a display device according to an embodiment.

Referring to FIGS. 12 and 14, a second pixel that is a pixel group PG disposed in a second display area can include a plurality of sub-pixels. Here, the plurality of sub-pixels can include a red sub-pixel R as a first sub-pixel, a green sub-pixel G as a second sub-pixel, and a blue sub-pixel B as a third sub-pixel.

Each of the plurality of sub-pixels can be disposed to be spaced apart from each other and can be disposed on the anti-reflection layer ARL1.

As shown in FIG. 14, the red sub-pixel R and green sub-pixels G disposed adjacent to each other can be disposed to be spaced apart from each other by a first distance d1. In addition, the green sub-pixel G and the blue sub-pixel B, which are disposed adjacent to each other, can be disposed to be spaced apart from each other by a second distance d2. In this case, the first distance d1 can be a minimum distance between the sub-pixels.

Further, in consideration of the arrangement of the bank BNK disposed to be overlapped with the space S, each of the plurality of sub-pixels can be disposed to be spaced apart from the boundary line BL. In this case, the minimum distance between the sub-pixels can be equal to a separation distance d3 between the boundary line BL and the sub-pixels.

Figure 15:
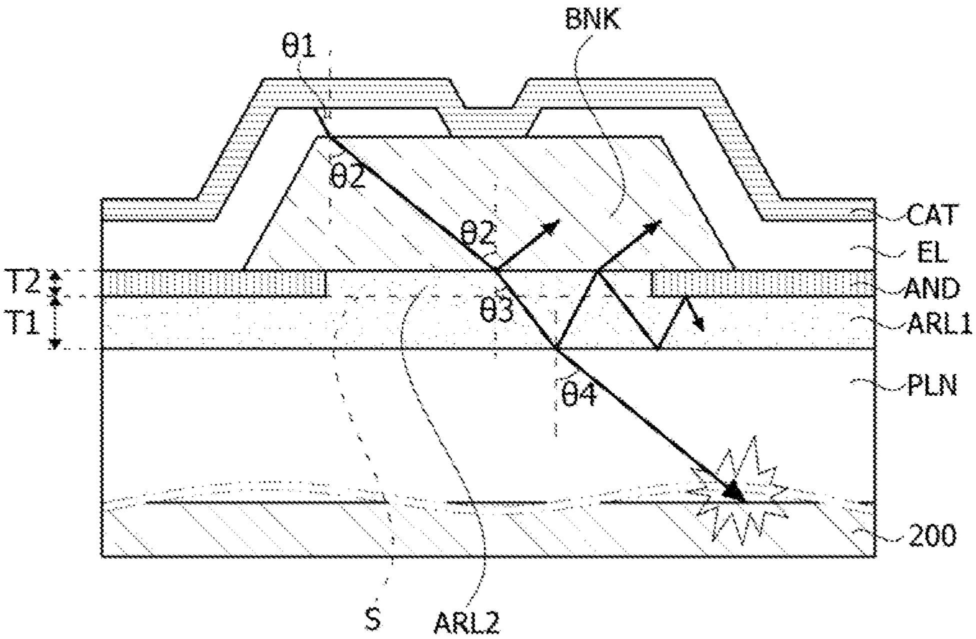
FIG. 15 is a diagram schematically illustrating a relationship between a light-path changing structure and a light path according to a second embodiment of the present disclosure.
Figures 16, 17:
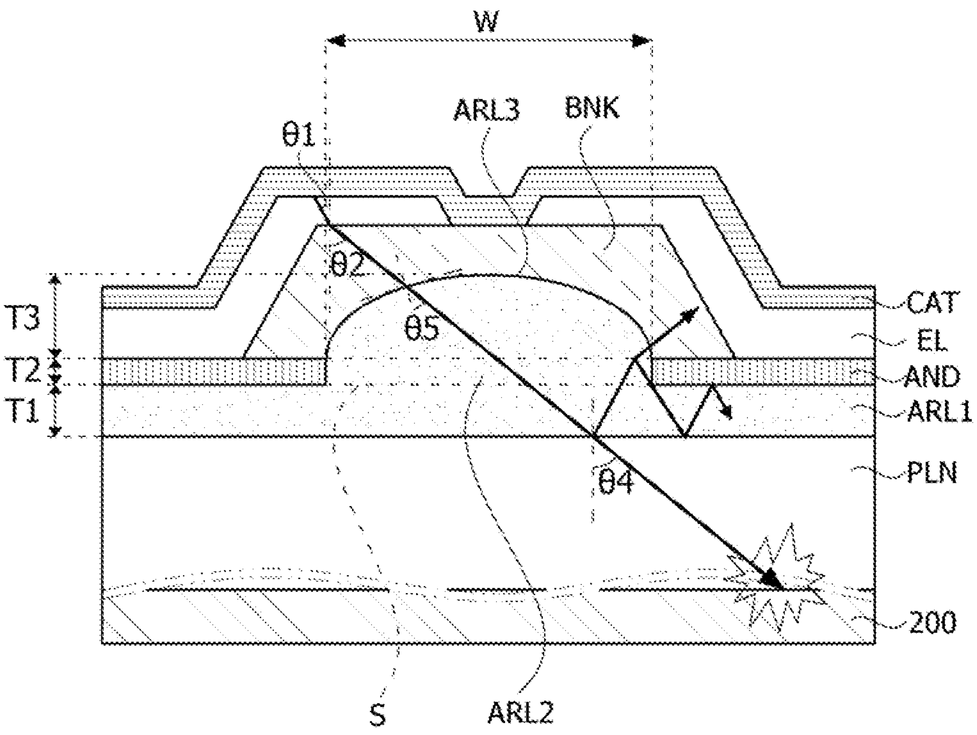
FIG. 16 is a table showing infrared-ray blocking rates according to thicknesses of an anti-reflection layer and a connection layer provided in the light-path changing structure according to the second embodiment.
FIG. 17 is a diagram schematically illustrating a relationship between a light-path changing structure and a light path according to a third embodiment of the present disclosure.

FIG. 15 is a diagram schematically illustrating a relationship between a light-path changing structure and a light path according to a second embodiment of the present disclosure, and FIG. 16 is a table showing infrared-ray blocking rates depending on thicknesses of an anti-reflection layer and a connection layer provided as a light-path changing structure according to the second embodiment. In addition, arrows shown in FIG. 15 can indicate light paths.

With reference to FIG. 15, comparing the display device according to the first embodiment and the display device according to the second embodiment, the display device according to the second embodiment is different in that it further includes a connection layer ARL2 which is disposed in the space S and formed of the same material as the anti-reflection layer ARL1.

Accordingly, the display device according to the second embodiment can minimize the influence of light reaching the optical device 200 by reflecting and refracting light directed to the optical device 200 through the space S by means of the anti-reflection layer ARL1 and the connection layer ARL2. In this case, the display device according to the second embodiment can increase the thickness T1 of the anti-reflection layer ARL1 through the connection layer ARL2 to adjust the blocking rate of light directed to the optical device 200.

The display device according to the second embodiment can include a bank BNK partitioning a light emitting element, an anode electrode AND of the light emitting element disposed spaced apart and disposed adjacent to each other to form a space S, a planarization layer PLN disposed under the anode electrode AND, an anti-reflection layer ARL1 disposed between the planarization layer PLN and the anode electrode AND of the light emitting element, and a connection layer ARL2 disposed in the space S and provide the connection layer ARL2 and the anti-reflection layer ARL1 having a different refractive index relative to the planarization layer PLN as a light-path changing structure according to the second embodiment, thereby minimizing the influence of light reaching the optical device 200.

Here, the connection layer ARL2 can be extended from an upper portion of the anti-reflection layer ARL1 toward the bank BNK to fill the space S. Accordingly, it can be confirmed that the infrared ray blocking rate depending on the thickness T2 of the connection layer ARL2 is increased relative to the infrared ray blocking rate shown in FIG. 13 (See FIGS. 13 and 16).

Therefore, the blocking rate of light directed to the optical device 200 is adjusted depending on the thickness in which the anti-reflection layer ARL1 and the connection layer ARL2 are formed.

Meanwhile, as an example, the connection layer ARL2 is filled in the entire space S, but is not necessarily limited thereto. For example, the connection layer ARL2 can be filled in only a part of the space S. Accordingly, the infrared ray blocking rate can also be adjusted by adjusting the thickness T2 of the connection layer ARL2.

Figure 18A:
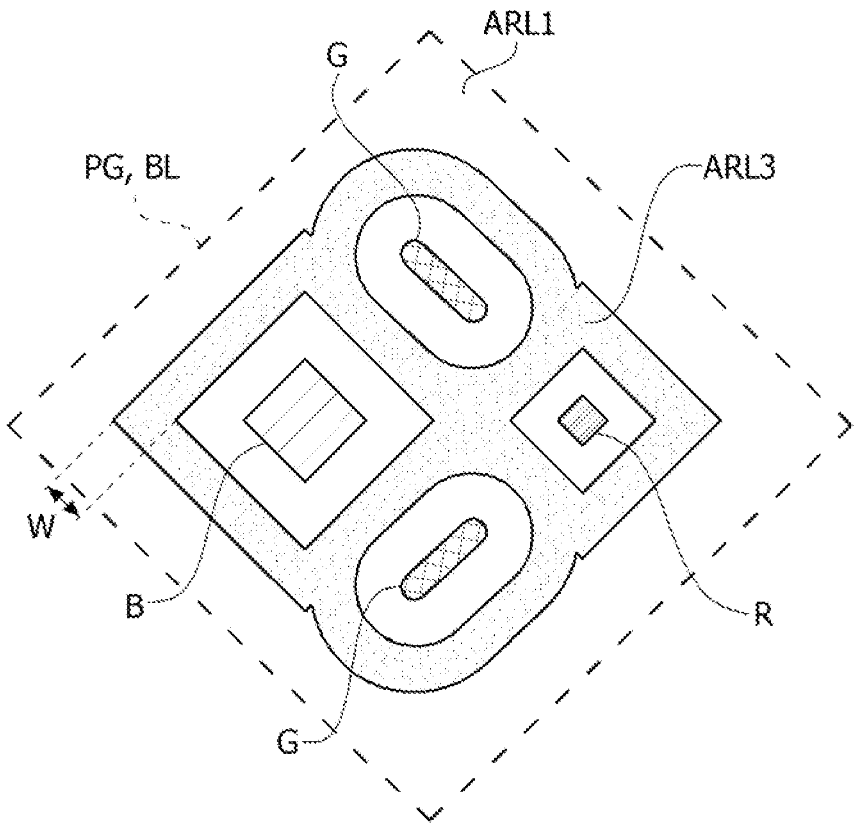
FIGS. 18A and 18B are diagrams illustrating an arrangement relationship between a light-path changing structure and a pixel group according to the third embodiment.
Figure 18B:
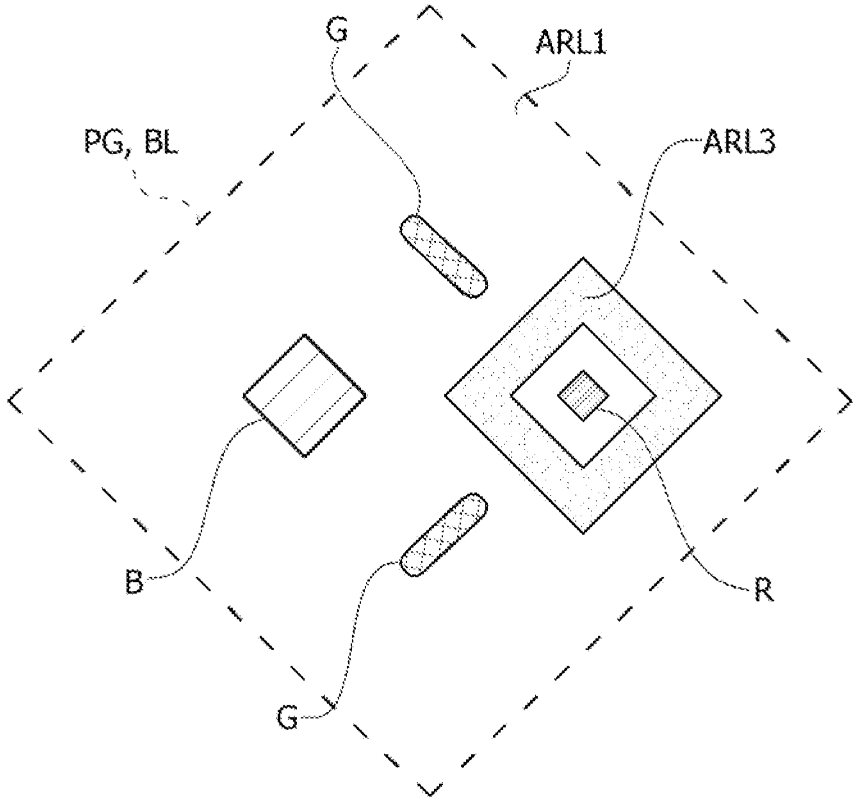

FIG. 17 is a diagram schematically illustrating a relationship between an light-path changing structure and a light path according to a third embodiment of the present disclosure, and FIGS. 18A and 18B are diagrams illustrating an arrangement relationship between the light-path changing structure and pixel groups according to the third embodiment, wherein FIG. 18A is a diagram in which a lens layer is disposed for each sub-pixel, and FIG. 18B is a diagram in which a lens layer is disposed only in a red sub-pixel. In addition, arrows shown in FIG. 17 can indicate light paths.

With reference to FIGS. 17 and 18A and 18B, comparing the display device according to the second embodiment and the display device according to the third embodiment, the display device according to the third embodiment is different in that it further includes a lens layer ARL3 disposed on an upper portion of the connection layer ARL2.

Accordingly, the display device according to the third embodiment can minimize the influence of light reaching the optical device 200 by reflecting and refracting light directed to the optical device 200 by means of the anti-reflection layer ARL1, the connection layer ARL2, and the lens layer ARL3. In this case, the display device according to the third embodiment can adjust the blocking rate of light directed to the optical device 200 by increasing the thickness T1+T2 of the anti-reflection layer ARL1 and the connection layer ARL2 by means of the lens layer ARL3. In addition, the display device according to the third embodiment can minimize the angle of refraction of light incident into the lens layer ARL3 by means of the shape of the lens layer ARL3 so that the light can be induced to be totally reflected and confined inside the anti-reflection layer ARL1.

The display device according to the third embodiment can include a bank BNK partitioning the light emitting element, an anode electrode AND of the light emitting element disposed spaced apart and disposed adjacent to each other to form a space S, a planarization layer PLN disposed under the anode electrode AND, an anti-reflection layer ARL1 disposed between the planarization layer PLN and the anode electrode AND of the light emitting element, a connection layer ARL2 disposed in the space S, and a lens layer ARL3 disposed on the upper portion of the connection layer ARL2, and provide the anti-reflection layer ARL1 having a different refractive index relative to the planarization layer PLN, the connection layer ARL2, and the lens layer ARL3 as a light-path changing structure according to the third embodiment, thereby minimizing the influence of light reaching the optical device 200. In this case, the lens layer ARL3 can be disposed to be overlapped with the connection layer ARL2.

Here, since the lens layer ARL3 integrally formed with the connection layer ARL2 is disposed inside the bank BNK and protrudes from the upper portion of the connection layer ARL2, the thickness T1+T2 of the anti-reflection layer ARL1 and the connection layer ARL2 can be increased. In this case, the lens layer ARL3 can be formed to have a predetermined thickness.

Therefore, the blocking rate of light directed to the optical device 200 is adjusted depending on the thickness T1+T2+T3 formed by means of the anti-reflection layer ARL1, the connection layer ARL2, and the lens layer ARL3.

The lens layer ARL3 can be disposed to have a predetermined separation distance from the sub-pixels, and can be disposed along the circumference of at least one of the plurality of sub-pixels, or can be disposed along the circumference of each sub-pixel.

In detail, since the wavelengths of light formed for each sub-pixel are different, the lens layer ARL3 can be formed in one of the plurality of sub-pixels in consideration of the blocking rate for each wavelength. Alternatively, the lens layer ARL3 can be disposed along the circumference of each sub-pixel and can have a different shape for each sub-pixel.

Meanwhile, in consideration of the influence of light reaching the optical device 200, the lens layer ARL3 can be formed in various shapes.

Since the light path is changed depending on the shape of the lens layer ARL3, the shape of the lens layer ARL3 can be presented as a third factor of the light-path changing structure that affects the light path change.

Referring to FIG. 17, the lens layer ARL3 can be formed to have a hemispherical cross-section with a central thickness greater than an edge thickness. Accordingly, the lens layer ARL3 can be formed to have a predetermined thickness T3 and width W, and a curved upper surface, and can be disposed along the circumference of the sub-pixel as shown in FIGS. 18A and 18B. Here, the width W of the lens layer ARL3 can be equal to the width of the space S and can be smaller than the width of the bank BNK.

Hereinafter, with reference to FIG. 17, a light path of light directed to the optical device 200 by means of the light-path changing structure according to the third embodiment will be described.

As the refractive indices of the organic compound layer EL and the bank BNK are different for each material, the light incident on the bank BNK at the first incident angle θ1 is refracted at a boundary surface between the organic compound layer EL and the bank BNK at the second exit angle θ2.

In addition, the light refracted at the boundary surface of the bank BNK is refracted at the boundary surface between the bank BNK and the lens layer ARL3 at a fifth exit angle θ5. Here, the fifth exit angle θ5 can be adjusted by the shape and refractive index of the lens layer ARL3.

In addition, a part of the light refracted at the fifth exit angle θ5 is reflected by the planarization layer PLN, and an another part is reflected at the boundary surface of the bank BNK, the anti-reflection layer ARL1, and the planarization layer PLN at the fourth exit angle θ4. Further, a still another part of the light is reflected and dissipated by the anode electrode AND and the boundary surface inside the anti-reflection layer ARL1.

Therefore, the display device according to the third embodiment can minimize the angle of refraction of light incident into the lens layer ARL3 by means of the shape of the lens layer ARL3, and a light path can be adjusted so that the light is totally reflected and confined inside the anti-reflection layer ARL1.

FIG. 19 is a table showing the blocking rate for each wavelength changed by the lens layer provided as the light-path changing structure according to the third embodiment, and FIG. 20 is a table showing the infrared-ray blocking rate by the lens layer provided as a light-path changing structure according to the third embodiment.

Referring to FIGS. 13 and 19, the blocking rate for each wavelength is different depending on the presence or absence of the lens layer ARL3. Accordingly, the display device according to the third embodiment can adjust the light path by means of the arrangement of the lens layer ARL3 in consideration of the influence of the wavelength reaching the optical device 200, and it can be confirmed that the blocking rate for each wavelength can be increased as shown in FIG. 19.

For example, since the influence of each wavelength of light is different depending on the type of sensor disposed in the optical device 200, in consideration of this, an arrangement of the lens layer ARL3 can be selected for each sub-pixel.

As shown FIG. 18B, when the lens layer ARL3 is disposed only around the red sub-pixel R, it can be confirmed that the infrared ray blocking rate depending on the lens layer ARL3 is increased relative to the infrared ray blocking rate shown in FIG. 16 (see FIGS. 16 and 20). In the case of an infrared sensor, since the influence of red light is great, in consideration of this, the lens layer ARL3 can be disposed only around the red sub-pixel R.

Further, the display device according to the third embodiment can adjust the amount of light reaching the optical device 200 by adjusting the thickness T3 relative to the width W of the lens layer ARL3. In this case, the thickness T3 of the lens layer ARL3 is formed smaller than the width W.

FIG. 21 is a diagram showing the amount of light reaching the optical device depending on the thickness relative to the width of the lens layer provided as the light-path changing structure according to the third embodiment.

Referring to FIG. 21, the display device according to the third embodiment can adjust the thickness T3 relative to the width W of the lens layer ARL3. For example, based on the display device according to the first embodiment to which the lens layer ARL3 is not applied, since the amount of light reaching the optical device 200 (or the amount of light reaching lower portion of the lens layer ARL3) is decreased as the thickness T3 relative to the width W (T3/W) of the lens layer ARL3 is decreased, the performance of the optical device 200 is improved. In detail, as the thickness T3 relative to the width W of the lens layer ARL3 is smaller; the angle of refraction of light incident into the lens layer ARL3 is smaller. As a result, since the amount of light totally reflected and confined inside the anti-reflection layer ARL1 is increased, the amount of light reaching the optical device 200 is decreased.

Theretofore, the display device according to the third embodiment can improve the performance of the optical device 200 by adjusting the thickness T3 relative to the width W of the lens layer ARL3.

Meanwhile, in the display device according to the third embodiment, the anti-reflection layer ARL1, the connection layer ARL2, and the lens layer ARL3 are integrally formed as an example, but is not necessarily limited thereto. For example, the lens layer ARL3 can be provided as a separate material having a refractive index different from that of the anti-reflection layer ARL1 and the connection layer ARL2. Accordingly, the display device according to the embodiment can adjust the amount of light reaching the optical device 200 by means of the lens layer ARL3 having a refractive index different from that of the anti-reflection layer ARL1 and the connection layer ARL2. In detail, the refractive index of the separately provided lens layer ARL3 is greater than that of the anti-reflection layer ARL1.

A brief description of the embodiments of the present disclosure described above is as follows.

A display device according to embodiments of the present disclosure includes a display panel comprising a first display area in which a plurality of first pixels are disposed, and a second display area in which a plurality of second pixels and a light-transmission area disposed between the second pixels are disposed; and a sensor disposed to correspond to the second display area, wherein the display panel includes a substrate, a circuit layer disposed on the substrate, a light emitting element layer disposed on the circuit layer, and an anti-reflection layer disposed between a planarization layer of the circuit layer and an anode electrode of the light emitting element layer, wherein the second pixel includes a plurality of sub-pixels, and a space is formed between an anode electrode of one of the plurality of sub-pixels and an anode electrode of another sub-pixel disposed adjacent to each other with the one sub-pixel, and a light path of light directed to the sensor through the space is changed by means of the anti-reflection layer.

In the display device according to the embodiments of the present disclosure, the second pixel includes a pixel-defining film disposed between the sub-pixels, and the pixel-defining film is disposed to be overlapped with the anti-reflection layer.

A display device according to embodiments of the present disclosure can include a display panel configured to include a first display area in which a plurality of first pixels are disposed, and a second display area in which a plurality of second pixels and a light-transmission area disposed between the second pixels are disposed, and a sensor disposed to correspond to the second display area, wherein the display panel can include a substrate, a circuit layer disposed on the substrate, a light emitting element layer disposed on the circuit layer, and an anti-reflection layer disposed between a planarization layer of the circuit layer and an anode electrode of the light emitting element layer, the second pixel can include a plurality of sub-pixels and a pixel-defining film disposed between the sub-pixels, and the pixel-defining film can be disposed to be overlapped with the anti-reflection layer.

In the display device according to the embodiments of the present disclosure, a space formed between an anode electrode of one of the plurality of sub-pixels disposed on the same layer and an anode electrode of another sub-pixel disposed adjacent to each other with the one sub-pixel can be disposed to be overlapped with the pixel-defining film.

In the display device according to the embodiments of the present disclosure, a refractive index of the anti-reflection layer can be greater than a refractive index of the planarization layer.

In the display device according to the embodiments of the present disclosure, the anti-reflection layer can be formed to have a predetermined thickness, and a blocking rate of light directed to the sensor through the space can be adjusted depending on the thickness of the anti-reflection layer.

In the display device according to the embodiments of the present disclosure, a connection layer disposed in the space can be further included.

In the display device according to the embodiments of the present disclosure, a lens layer disposed on the upper portion of the connection layer can be further included.

In the display device according to the embodiments of the present disclosure, the anti-reflection layer, the connection layer, and the lens layer can be integrally formed.

In the display device according to the embodiments of the present disclosure, the blocking rate of light directed to the sensor can be adjusted depending on the thickness formed by means of the anti-reflection layer, the connection layer, and the lens layer.

In the display device according to the embodiments of the present disclosure, the lens layer can be disposed along the circumference of at least one of the plurality of sub-pixels.

In the display device according to the embodiments of the present disclosure, the lens layer can be formed to have a hemispherical cross section.

In the display device according to the embodiments of the present disclosure, the lens layer can be formed to have a thickness smaller than a width, and the amount of light reaching the sensor can be decreased as the thickness relative to the width of the lens layer is decreased.

In the display device according to the embodiments of the present disclosure, the lens layer can be disposed inside the pixel-defining film.

In the display device according to the embodiments of the present disclosure, the plurality of sub-pixels can include a first sub-pixel, a second sub-pixel, and a third sub-pixel, and the lens layer can be disposed along the circumference of the first sub-pixel.

In the display device according to the embodiments of the present disclosure, the sensor can be an infrared sensor, and the first sub-pixel can be a red sub-pixel.

In the display device according to the embodiments of the present disclosure, the refractive index of the lens layer can be different from the refractive index of the anti-reflection layer.

In the display device according to the embodiments of the present disclosure, the second pixel can include a boundary line representing a pixel group, the boundary line can be the same as an area of the anti-reflection layer, and each of the plurality of sub-pixels can be disposed to be spaced apart from the boundary line.

In the display device according to the embodiments of the present disclosure, a minimum distance between the sub-pixels disposed adjacent to each other can be equal to a separation distance between the boundary line and the sub-pixels.

The objects to be achieved by the present disclosure, the means for achieving the objects, and effects of the present disclosure described above do not specify essential features of the claims, and thus, the scope of the claims is not limited to the specific description of the present disclosure.

Although the embodiments of the present disclosure have been described in more detail with reference to the accompanying drawings, the present disclosure is not limited thereto and can be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

REFERENCE NUMERALS DESCRIPTION

100: display panel
200: optical device
300: drive IC
400: host system
AND: anode electrode
ARL1: anti-reflection layer
ARL2: connection layer
ARL3: lens layer BNK: bank
PLN: planarization layer
PLN1: first planarization layer
PLN2: second planarization layer
S: space

What is claimed is:

1. A display device comprising:
a display panel including a first display area in which a plurality of first pixels are disposed, and a second display area in which a plurality of second pixels and a light-transmission area disposed between the second pixels are disposed; and
a sensor disposed to correspond to the second display area,
wherein the display panel includes a circuit layer disposed on a substrate, a light emitting element layer disposed on the circuit layer, and an anti-reflection layer disposed between a planarization layer of the circuit layer and an anode electrode of the light emitting element layer,
the anti-reflection layer is disposed under the anode electrode,
one second pixel among the plurality of second pixels includes a first sub-pixel and a second sub-pixel,
a space is formed between an anode electrode of the first sub-pixel and an anode electrode of the second sub-pixel disposed adjacent to the first sub-pixel, and
a path of light directed to the sensor through the space is changed by means of the anti-reflection layer.

2. The display device according to claim 1, further comprising a pixel-defining film disposed between the first sub-pixel and the second sub-pixel,
wherein the pixel-defining film overlaps with the anti-reflection layer.

3. The display device according to claim 2, wherein a refractive index of the pixel-defining film is the same as a refractive index of the planarization layer.

4. The display device according to claim 1, wherein a refractive index of the anti-reflection layer is equal to or greater than a refractive index of an organic compound layer of the light emitting element layer.

5. The display device according to claim 1, wherein the one second pixel includes a boundary line representing a pixel group,
an area of the anti-reflection layer corresponds to the boundary line, and
each of the first sub-pixel and the second sub-pixel is disposed spaced apart from the boundary line.

6. A display device comprising:
a display panel including a first display area in which a plurality of first pixels are disposed, and a second display area in which a plurality of second pixels and a light-transmission area disposed between the second pixels are disposed; and
a sensor disposed to correspond to the second display area,
wherein the display panel includes a circuit layer disposed on a substrate, a light emitting element layer disposed on the circuit layer, and an anti-reflection layer disposed between a planarization layer of the circuit layer and an anode electrode of the light emitting element layer,
one second pixel among the plurality of second pixels includes a first sub-pixel, a second sub-pixel, and a pixel-defining film disposed between the first sub-pixel and the second sub-pixel,
the pixel-defining film overlaps with the anti-reflection layer, and
the anti-reflection layer is disposed under the anode electrode.

7. The display device according to claim 6, wherein a space formed between an anode electrode of the first sub-pixel disposed on a same layer and an anode electrode of the second sub-pixel disposed adjacent to the first sub-pixel, overlaps with the pixel-defining film.

8. The display device according to claim 7, wherein a refractive index of the anti-reflection layer is greater than a refractive index of the planarization layer.

9. The display device according to claim 8, wherein the anti-reflection layer is formed to have a predetermined thickness, and
a blocking rate of light directed to the sensor through the space is adjusted depending on the thickness of the anti-reflection layer.

10. The display device according to claim 8, further comprising a connection layer disposed in the space.

11. The display device according to claim 10, further comprising a lens layer disposed on an upper portion of the connection layer.

12. The display device according to claim 11, wherein the anti-reflection layer, the connection layer, and the lens layer are integrally formed.

13. The display device according to claim 12, wherein a blocking rate of light directed to the sensor is adjusted depending on a thickness set by the anti-reflection layer, the connection layer, and the lens layer that are integrally formed.

14. The display device according to claim 11, wherein the lens layer is disposed along a circumference of at least one of the first sub-pixel and the second sub-pixel.

15. The display device according to claim 11, wherein the lens layer is formed to have a hemispherical cross section.

16. The display device according to claim 15, wherein the lens layer is formed to have a thickness smaller than a width, and
an amount of light reaching the sensor is decreased as the thickness relative to the width of the lens layer is decreased.

17. The display device according to claim 11, wherein the lens layer is disposed inside the pixel-defining film.

18. The display device according to claim 17, wherein the one second pixel among the plurality of second pixels further includes a third sub-pixel, and
the lens layer is disposed along a circumference of the first sub-pixel.

19. The display device according to claim 18, wherein the sensor is an infrared sensor, and the first sub-pixel is a red sub-pixel.

20. The display device according to claim 11, wherein a refractive index of the lens layer is different from the refractive index of the anti-reflection layer.

* * * * *